United States Patent
Frougier et al.

(10) Patent No.: US 11,887,643 B2
(45) Date of Patent: Jan. 30, 2024

(54) INTEGRATED MAGNETIC SHIELD FOR MRAM ARRAYS

(71) Applicant: International Business Machines Corporation, Armonk, NY (US)

(72) Inventors: Julien Frougier, Albany, NY (US); Dimitri Houssameddine, Sunnyvale, CA (US); Kangguo Cheng, Schenectady, NY (US); Ruilong Xie, Niskayuna, NY (US)

(73) Assignee: International Business Machines Corporation, Armonk, NY (US)

( * ) Notice: Subject to any disclaimer, the term of this patent is extended or adjusted under 35 U.S.C. 154(b) by 248 days.

(21) Appl. No.: 17/391,434

(22) Filed: Aug. 2, 2021

(65) Prior Publication Data
US 2023/0032984 A1 Feb. 2, 2023

(51) Int. Cl.
*G11C 11/00* (2006.01)
*G11C 11/16* (2006.01)
(Continued)

(52) U.S. Cl.
CPC ........ *G11C 11/1695* (2013.01); *G11C 11/161* (2013.01); *G11C 11/1655* (2013.01);
(Continued)

(58) Field of Classification Search
CPC ................... H10B 61/00; H10B 61/22; G11C 2211/5615; G11C 11/161; G11C 11/16;
(Continued)

(56) References Cited

U.S. PATENT DOCUMENTS 6,929,957 B2   8/2005   Min et al.
7,239,543 B2   7/2007   Chung et al.
(Continued)

FOREIGN PATENT DOCUMENTS

CN    104518080 A    4/2015

OTHER PUBLICATIONS

Coyne, K., "Faraday Cage", National High Magnetic Field Laboratory, last modified on Dec. 16, 2016, 7 pages, https://nationalmaglab.org/about/around-the-lab/what-the/faraday-cage.
(Continued)

*Primary Examiner* — Thong Q Le
(74) *Attorney, Agent, or Firm* — Scully, Scott, Murphy & Presser, P.C.; Daniel P. Morris, Esq.

(57) ABSTRACT

A magnetic shielding structure for protecting an MRAM array from adverse switching effects due to external magnetic fields of neighboring devices is provided. The magnetic shielding structure includes a bottom magnetic shield material-containing layer and a top magnetic shield material-containing layer within the MRAM array. The bottom and top magnetic shield material-containing layers can be connected by a vertical magnetic shield containing-material layer that is located near each end of the bottom and top magnetic shield material-containing layers. The bottom magnetic shield material-containing layer is located beneath a MTJ pillar of each MRAM device, but above, bottom electrically conductive structures that are in electrical contact with the MRAM devices. The top magnetic shield material-containing layer is located above the MRAM devices, and is located laterally adjacent to, but not above or below, top electrically conductive structures that are also in electrical contact with the MRAM devices.

20 Claims, 23 Drawing Sheets

(51) Int. Cl.
*H01L 23/552* (2006.01)
*H10B 61/00* (2023.01)
*H10N 50/01* (2023.01)
*H10N 50/10* (2023.01)
*H10N 50/80* (2023.01)
*H10N 50/85* (2023.01)

(52) U.S. Cl.
CPC .......... *H01L 23/552* (2013.01); *H10B 61/22* (2023.02); *H10N 50/01* (2023.02); *H10N 50/10* (2023.02); *H10N 50/80* (2023.02); *H10N 50/85* (2023.02)

(58) Field of Classification Search
CPC ......... G11C 11/00; G11C 16/04; G11C 17/02; G11C 11/15; G11C 11/22; G11C 11/24; G11C 13/00; H01L 21/76885; H01L 23/5226; H10N 50/01; H10N 50/10; H10N 50/80; H10N 35/01; H10N 70/24; H10N 50/85; H01F 10/32
See application file for complete search history.

(56) References Cited

U.S. PATENT DOCUMENTS

| | | | |
|---|---|---|---|
| 7,829,980 | B2 | 11/2010 | Molla et al. |
| 8,125,057 | B2 | 2/2012 | Bonin et al. |
| 8,557,610 | B2 | 10/2013 | Chen et al. |
| 9,024,399 | B2 | 5/2015 | Guo |
| 9,048,413 | B2 | 6/2015 | Zeng |
| 9,564,403 | B2 | 2/2017 | Allinger et al. |
| 9,647,205 | B2 | 5/2017 | Popelar et al. |
| 9,786,839 | B2 | 10/2017 | Bhushan et al. |
| 10,096,768 | B2 * | 10/2018 | Jiang ..................... H10B 61/20 |
| 10,374,154 | B1 | 8/2019 | Houssameddine et al. |
| 2016/0359100 | A1 | 12/2016 | Bhushan et al. |
| 2017/0025471 | A1 | 1/2017 | Bhushan et al. |
| 2019/0207083 | A1 | 7/2019 | Zhong et al. |

OTHER PUBLICATIONS

"MUMETAL", printed on Jul. 30, 2021, 3 pages, http://www.mu-metal.com/technical-data.html.
Schaeffer, J., et al., "Method for Fabricating Magnetic Multilayers", IP.com technical disclosure, Apr. 10, 2002, 7 pages.

* cited by examiner

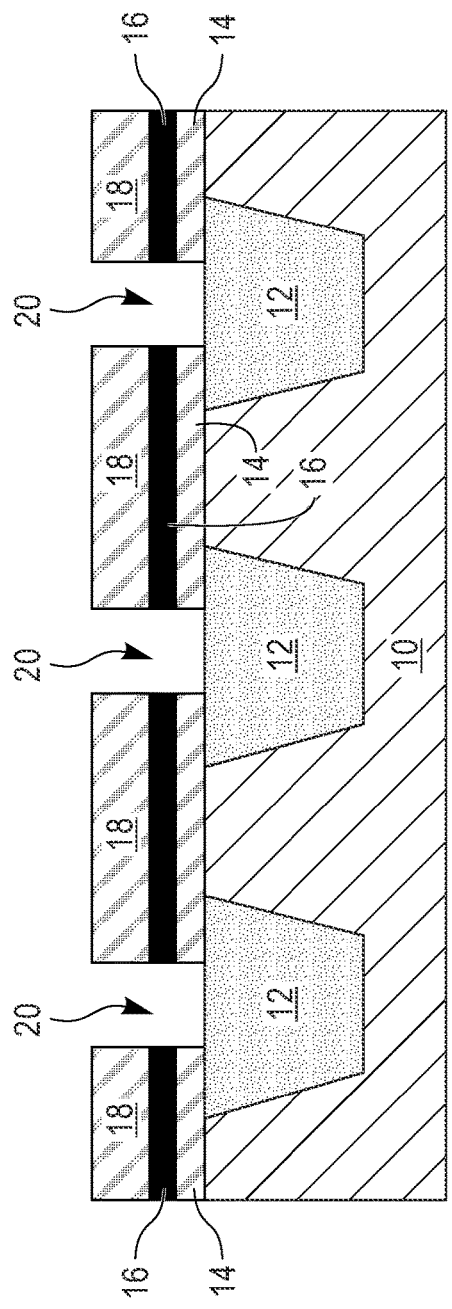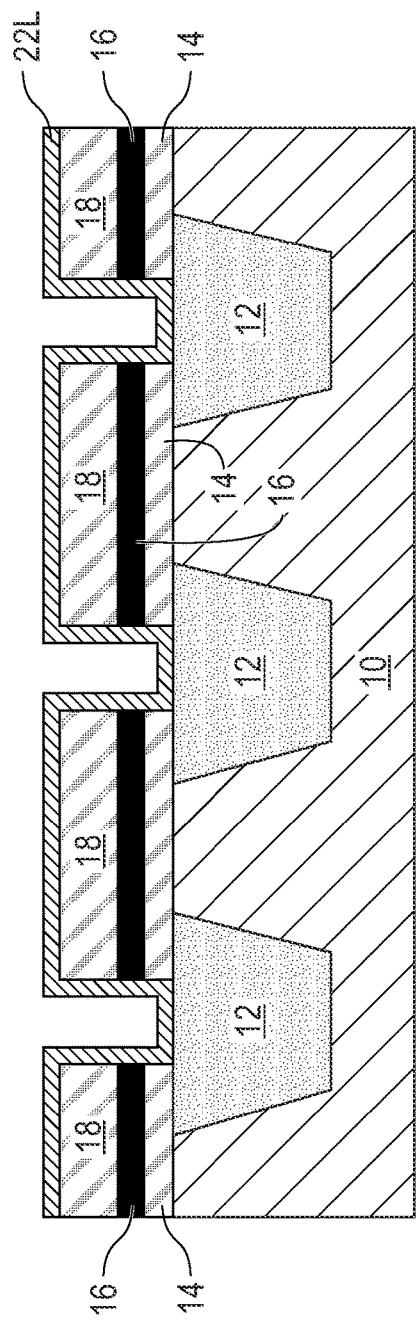

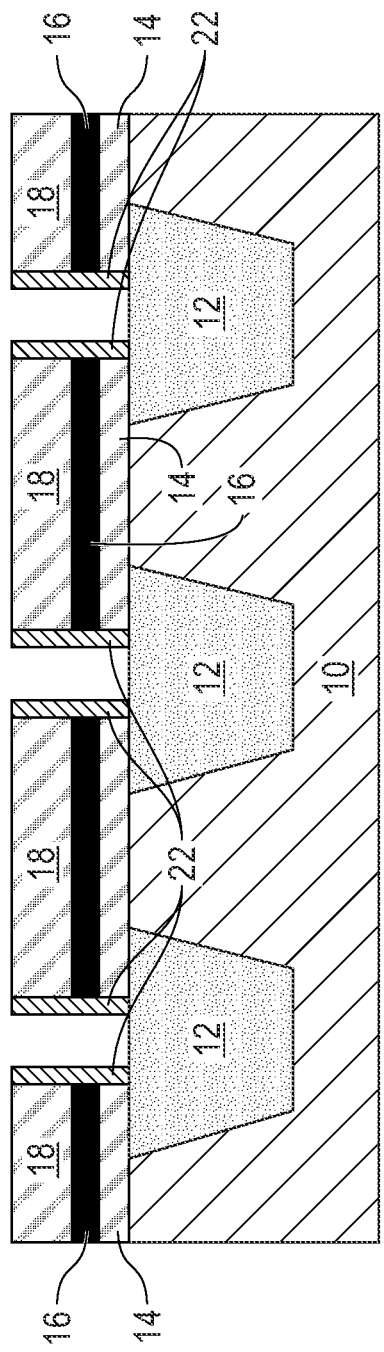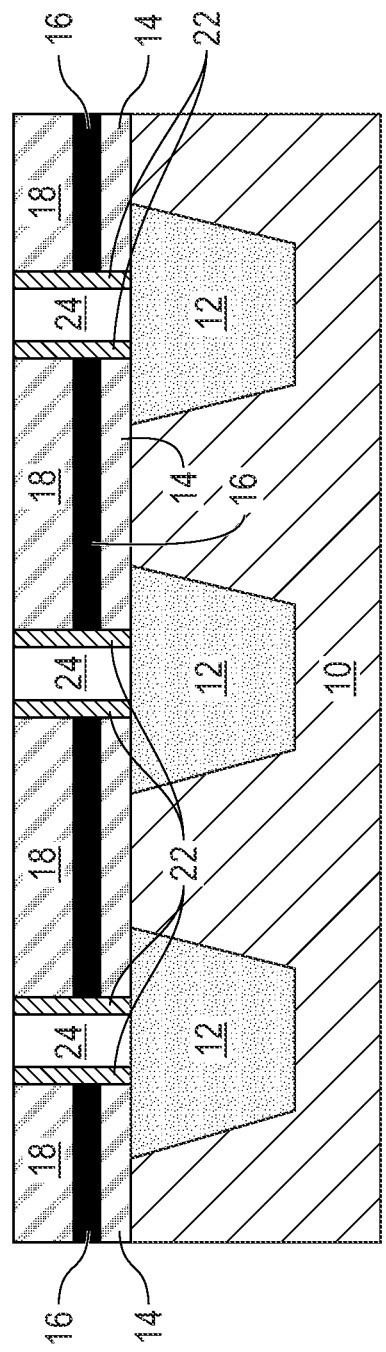

INTEGRATED MAGNETIC SHIELD FOR MRAM ARRAYS

BACKGROUND

The present application relates to non-volatile memory, and more particularly to a magnetoresistive random access memory (MRAM) array that is integrated with a magnetic shield structure.

MRAM is a non-volatile random access memory technology in which data is stored by magnetic storage elements. These magnetic storage elements are typically formed from two ferromagnetic plates, each of which can hold a magnetization, separated by a thin dielectric layer (i.e., a tunnel barrier layer). One of the two plates (i.e., the magnetic reference or pinned layer) is a magnet whose magnetic moment direction is set to a particular direction; the other plate's (i.e., the magnetic free layer's) magnetization can be changed in at least two different directions, representing different digital states such as 0 and 1 for memory applications. In MRAM, magnetic storage element containing a magnetic pinned layer (oftentimes referred also to a magnetic reference layer), a tunnel barrier layer, and a magnetic free layer, can be referred to as a magnetic tunnel junction (MTJ) pillar. MRAMs are presently being formed in the middle-of-the-line (MOL) level or back-end-of-the-line (BEOL) level.

One type of MRAM that can use MTJ pillars as magnetic storage elements is spin-transfer torque (STT) MRAM. STT MRAM has the advantages of lower power consumption and better scalability over conventional MRAM which uses magnetic fields to flip the active elements. In STT MRAM, spin-transfer torque is used to flip (switch) the orientation of the magnetic free layer. For an STT MRAM device, a current passing through the MTJ pillar is used to switch, or "write" the bit-state of the memory element. A current passing down through the MTJ pillar makes the magnetic free layer parallel to the magnetic reference layer, while a current passed up through the MTJ pillar makes the magnetic free layer anti-parallel to the magnetic pinned layer.

One major challenge associated with MRAM (including STT MRAM) technology is to minimize the switching disturbance of MTJ pillars caused by external magnetic fields. The magnetic interference generated by an external magnetic field not only distorts or changes the spin within the MTJ pillars, but also induces change on the electrical signals of the circuits. READ and WRITE operations in the MTJ pillars are inevitably affected by external magnetic fields and/or local magnetic fields. These cause relatability issues in MRAMs that contain magnetic storage elements composed of MTJ pillars.

The relatability issues have been previously addressed by forming a magnetic shield at the package level or by forming a magnetic shield at the bit level. Magnetic shields formed at the package level are expensive, and prior magnetic shields at the bit level are susceptible to operational interference caused by the close proximity between the shielding materials and the MTJ pillars. There is thus a need to provide a reliable and cost-effective magnetic shield structure integrated at the array level that protects the MTJ pillars of MRAMs from external magnetic fields.

SUMMARY

A magnetic shielding structure for protecting an MRAM array containing MRAM devices from adverse switching effects due to external magnetic fields of neighboring devices is provided. The magnetic shielding structure includes a bottom magnetic shield material-containing layer and a top magnetic shield material-containing layer within the MRAM array. The bottom and top magnetic shield material-containing layers can be connected by a vertical magnetic shield containing-material layer that is located near each end of the bottom and top magnetic shield material-containing layers. The bottom magnetic shield material-containing layer is located beneath a MTJ pillar of each of the MRAM devices, but above, bottom electrically conductive structures that are in electrical contact with the MRAM devices. The top magnetic shield material-containing layer is located above the MRAM devices, and is located laterally adjacent to, but not above or below, top electrically conductive structures that are also in electrical contact with the MRAM devices.

The magnetic shielding structure enables top and bottom, and in some instances, lateral, magnetic shielding of the MRAM devices to prevent magnetic interferences generated by external magnetic fields. The magnetic shielding structure is formed at the MRAM device level instead of at the packing level thus improving shielding efficiency. The magnetic shielding structure can be formed using a cost-efficient method.

In one aspect of the present application, a non-volatile memory structure is provided. In one embodiment, the non-volatile memory structure includes an MRAM array including a plurality of MRAM devices, wherein each MRAM device of the plurality of MRAM devices includes a bottom electrode, a MTJ pillar, and a top electrode, and each MRAM device is located between a first electrically conductive structure and a second electrically conductive structure. A bottom magnetic shield containing-material layer is located beneath each MTJ pillar, but above the first electrically conductive structure, and a top magnetic shield containing-material layer is located above each MRAM device. In the present application, the top magnetic shield containing-material layer is positioned laterally adjacent to, yet not above or below, the second electrically conductive structure.

In some embodiments, the non-volatile memory structure includes a vertical magnetic shield containing-material layer located near each end of the bottom magnetic shield containing-material layer and the top magnetic shield containing-material layer, wherein the vertical magnetic shield containing-material layer connects the bottom and top magnetic shield containing-material layers together to provide a ring shaped magnetic shield containing-material structure that surrounds each MRAM device of the plurality of MRAM devices. Stated in other terms a continuous enclosed magnetic shield box (i.e., the ring shaped shield containing-material structure) is provided all around the plurality of MRAM devices.

In some embodiments, the second electrically conductive structure includes a lower second electrically conductive structure, an inter-via magnetic shield material-containing layer and an upper second electrically conductive structure, wherein the inter-via magnetic shield material-containing layer is laterally adjacent to the top magnetic shield material-containing layer.

In another aspect of the present application, a method of forming a non-volatile memory structure is provided. In one embodiment, the method includes forming a magnetic shield-containing material stack on a metal level containing first electrically conductive structures embedded in a first interlayer dielectric (ILD) material layer, wherein the magnetic shield-containing material stack includes a bottom magnetic shield material-containing layer sandwiched between a bottom cladding dielectric material layer and a top cladding dielectric material layer, Next, a plurality of openings is formed in the magnetic shield-containing material stack, wherein each opening physically exposes a surface of one of the first electrically conductive structures embedded in the first ILD material layer. A bottom sidewall spacer and a bottom electrode structure are then formed in each of the openings, and thereafter an MTJ-containing structure is formed on top of each bottom electrode, wherein the MTJ-containing structure includes a MTJ pillar and a top electrode. A second ILD material layer is then formed laterally surrounding, and on top of, each of the MTJ-containing structures. Next, a top magnetic shield material-containing layer is formed on a topmost surface of the second ILD material layer, and thereafter a third ILD material layer is formed on the top magnetic shield material-containing layer, wherein the third ILD material layer includes second electrically conductive structures embedded therein, wherein each second electrically conductive structure contacts a surface of one of the underlying MTJ-containing structures and is isolated from the top magnetic shield material-containing layer by a top sidewall spacer.

BRIEF DESCRIPTION OF THE DRAWINGS

FIG. 4 is a cross sectional view of the exemplary structure of FIG. 3 after forming a plurality of openings in the magnetic shield-containing material stack, wherein each opening physically exposes a surface of one of the first electrically conductive structures embedded in the first ILD material layer.

FIG. 5 is a cross sectional view of the exemplary structure of FIG. 4 after forming a first conformal dielectric material layer on a topmost surface of the magnetic shield-containing material stack and in each of the openings.

FIG. 6 is a cross sectional view of the exemplary structure of FIG. 5 after performing an anisotropic spacer etch on the first conformal dielectric material layer to provide a bottom sidewall spacer in each of the openings.

FIG. 7 is a cross sectional view of the exemplary structure of FIG. 6 after forming a bottom electrode in a remaining volume of each opening.

DETAILED DESCRIPTION

Figure 2:
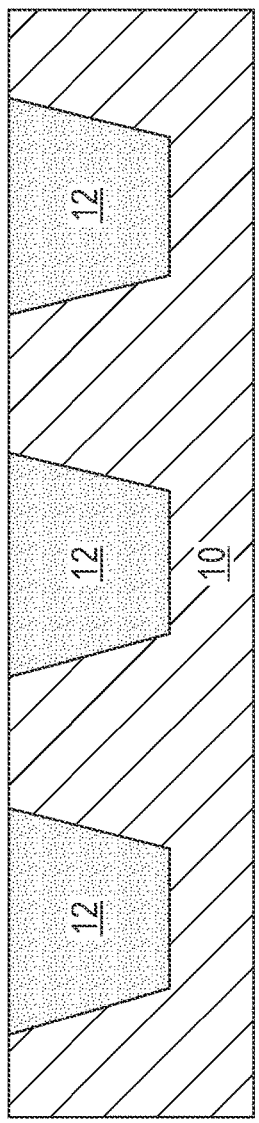
FIG. 2 is a cross sectional view along X-X shown in FIG. 1 of an exemplary structure including metal level, $M_n$, that includes first electrically conductive structures embedded in a first interlayer dielectric (ILD) material layer.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the following description, numerous specific details are set forth, such as particular structures, components, materials, dimensions, processing steps and techniques, in order to provide an understanding of the various embodiments of the present application. However, it will be appreciated by one of ordinary skill in the art that the various embodiments of the present application may be practiced without these specific details. In other instances, well-known structures or processing steps have not been described in detail in order to avoid obscuring the present application.

It will be understood that when an element as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "beneath" or "under" another element, it can be directly beneath or under the other element, or intervening elements may be present. In contrast, when an element is referred to as being "directly beneath" or "directly under" another element, there are no intervening elements present.

Figure 1:
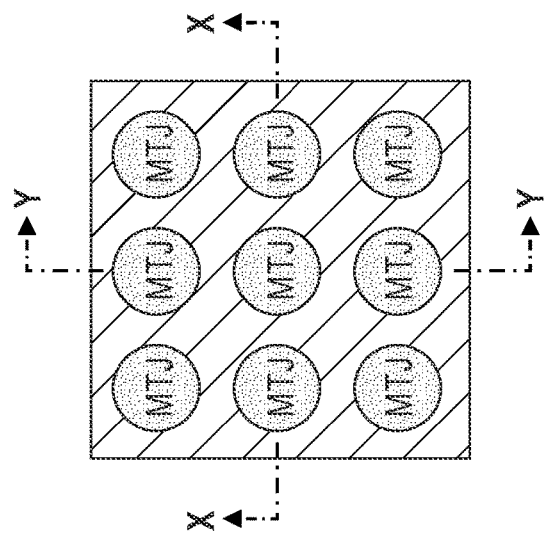
FIG. 1 is a top-down view illustrating an array of MTJ-containing structures arranged in the X-X direction and in the Y-Y direction.

Prior to discussing the present application in detail, it is noted that FIGS. 2-17 and 21 of the present application depict a memory device area in which a non-volatile memory device in accordance with the present application will be formed. A non-memory device area may be located laterally adjacent to the memory device area illustrated in the present application. The non-memory device area is an area in which interconnect structures, back-end-of-the line (BEOL) capacitors, resistors, and/or eFuses can be formed. It is further noted that the non-volatile memory device includes an array of MTJ-containing structures as shown in FIG. 1 in which the MTJ-containing structures, MTJs, can be arranged in rows (i.e., the X-X direction) and in columns (i.e., in the Y-Y direction). In FIGS. 2-17 and 21 of the present application, only the X-X direction of the array is shown, since the array in the Y-Y direction would be equivalent to the array in the X-X.

Referring now to FIG. 2, there is illustrated an exemplary structure including a metal level, $M_n$, that includes first electrically conductive structures 12 embedded in a first ILD material layer 10. In metal level, $M_n$, n is any integer starting from 1; the upper limit of 'n' can vary and can be predetermined by the manufacturer of a specific integrated circuit. In some embodiments (not shown), a diffusion barrier liner can be located between each first electrically conductive structure 12 and the first ILD material layer 10. It should be noted that each first electrically conductive structure 12 can extend entirely through the first ILD material layer 10, or other electrically conductive structures such as, for example, metal lines and/or metal vias, can be located directly beneath and in contact with each of the first electrically conductive structures 12. For simplicity, FIGS. 2-17 and 21 only show that each first electrically conductive structure 12 extends only partially through the first ILD material layer 10.

Although not illustrated in FIGS. 2-17 and 12, a substrate can be located beneath metal level, $M_n$. The substrate can include a front-end-of the-line (FEOL) level including one or more semiconductor devices, such as, for example, field effect transistors located on a semiconductor material; a middle-of-the-line (MOL) level including a plurality of metal contact structures embedded in a MOL dielectric material layer; at least one lower interconnect level that includes a plurality of lower interconnect structures embedded in a lower interconnect dielectric material layer; or any combination thereof. In one example, the substrate includes a FEOL and a MOL.

The metal level, $M_n$, can be formed utilizing techniques that are known to those skilled in the art. In one embodiment, a damascene process can be used in forming metal level, $M_n$. A damascene process can include forming openings into the first ILD material layer 10, filling the openings with an optional diffusion barrier layer, and an electrically conductive material and, if needed performing a planarization process such as, for example, chemical mechanical polishing (CMP) to remove the optional diffusion barrier layer and the electrically conductive material from the topmost surface of the first ILD material layer 10. The diffusion barrier layer that remains in each opening can be referred to herein as diffusion barrier liner (not shown), and the electrically conductive material that remains in each opening can be referred to herein as a first electrically conductive structure 12. In some embodiments, and as shown in FIG. 2, each first electrically conductive structure 12 has a topmost surface that is coplanar with a topmost surface of the first ILD material layer 10.

The first ILD material layer 10 can be composed of a dielectric material such as, for example, silicon dioxide, silicon nitride, undoped silicate glass (USG), fluorosilicate glass (FSG), borophosphosilicate glass (BPSG), a spin-on low-k dielectric material, a self-planarizing low-k dielectric (such as, for example, OMTS, OMCATS, TOMCATS, DMDMOS), a chemical vapor deposition (CVD) low-k dielectric material or any combination thereof. The term "low-k" as used throughout the present application denotes a dielectric material that has a dielectric constant of 4.0 or less. Illustrative low-k dielectric materials that can be used as the first ILD material layer 10 include, but are not limited to, silsesquioxanes, C doped oxides (i.e., organosilicates) that includes atoms of Si, C, O and H, thermosetting polyarylene ethers, or multilayers thereof. The term "polyarylene" is used in this application to denote aryl moieties or inertly substituted aryl moieties which are linked together by bonds, fused rings, or inert linking groups such as, for example, oxygen, sulfur, sulfone, sulfoxide, carbonyl and the like. Although not shown, the first ILD material layer 10 can include a multilayered structure that includes at least two different dielectric materials stacked one atop the other. The first ILD material layer 10 can be formed utilizing a deposition process including, for example, chemical vapor deposition (CVD), plasma enhanced chemical vapor deposition (PECVD), evaporation or spin-on coating.

The diffusion barrier layer (and thus the resultant diffusion barrier liner) that can optionally be employed in the present application in metal level, $M_n$, includes a diffusion barrier material (i.e., a material that serves as a barrier to prevent a conductive material such as copper from diffusing there through). Examples of diffusion barrier materials that can be used in providing the diffusion barrier layer (and thus the resultant diffusion barrier liner) include, but are not limited to, Ta, TaN, Ti, TiN, Ru, RuN, RuTa, RuTaN, W, or WN; in some instances of the present application chemical symbols, as found in the Periodic Table of Elements, are used instead of the full names of the elements or compounds. In some embodiments, the diffusion barrier material can include a material stack of diffusion barrier materials. In one example, the diffusion barrier material can be composed of a stack of Ta/TaN. The diffusion barrier layer can be formed by a deposition process such as, for example, CVD, PECVD, or physical vapor deposition (PVD).

The electrically conductive material that provides each of the first electrically conductive structures 12 can include, but is not limited to, Cu, Al, W, Ru or any alloy thereof (i.e., a Cu—Al alloy). The electrically conductive material that provides each of the first electrically conductive structures 12 can be formed by a deposition process such as, for example, CVD, PECVD, PVD, sputtering or platting. In some embodiments, a reflow anneal can follow the deposition of the electrically conductive material that provides the first electrically conductive structures 12.

In some embodiments, an upper portion of each first electrically conductive structure 12 can be etched back such that the topmost surface of each first electrically conductive structure 12 is located beneath the topmost surface of the first ILD material layer 10. In such an embodiment, at lower portion of the bottom electrode 24 (to be formed in a latter processing step of the present application) will be embedded in an upper portion of the first ILD material layer 10. Typically, and as stated above, each first electrically conductive structure 12 has a topmost surface that is coplanar with a topmost surface of the first ILD material layer 10.

Figure 3:
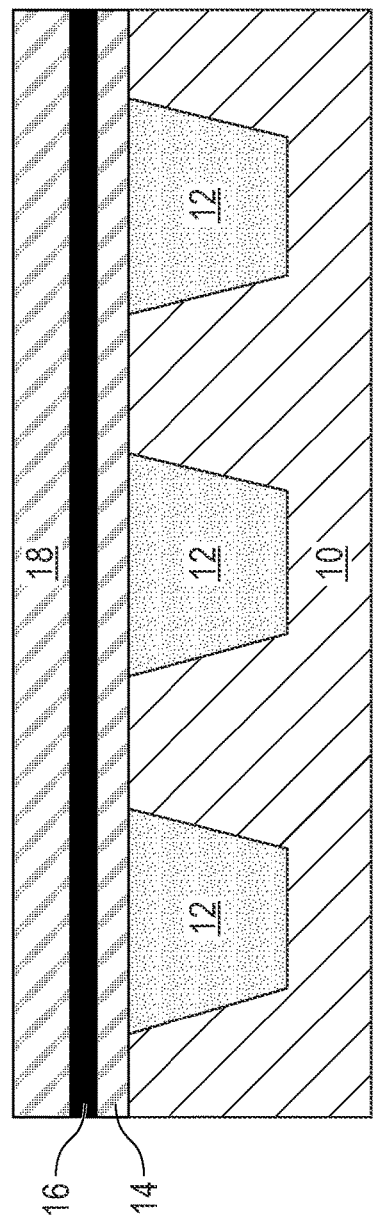
FIG. 3 is a cross sectional view of the exemplary structure of FIG. 2 after forming a magnetic shield-containing material stack on metal level, $M_n$, the magnetic shield-containing material stack including a bottom magnetic shield material-containing layer sandwiched between a bottom cladding dielectric material layer and a top cladding dielectric material layer.

Reference is now made to FIG. 3, which illustrates the exemplary structure of FIG. 2 after forming a magnetic shield-containing material stack 14/16/18 on metal level, Mn. The magnetic shield-containing material stack 14/16/18 includes a bottom magnetic shield material-containing layer 16 sandwiched between a bottom cladding dielectric material layer 14 and a top cladding dielectric material layer 18.

The bottom cladding dielectric material layer 14 and the top cladding dielectric material layer 18 are composed of a low-k dielectric material as defined herein above. Illustrative examples of low-k dielectrics materials that can be employed as the bottom cladding dielectric material layer 14 and the top cladding dielectric material layer 18 include, but are not limited to, silicon dioxide, silicon nitride, undoped silicate glass (USG), fluorosilicate glass (FSG), borophosphosilicate glass (BPSG), a spin-on low-k dielectric material, a self-planarizing low-k dielectric (OMTS, OMCATS, TOM-CATS, DMDMOS), a chemical vapor deposition (CVD) low-k dielectric material. The low-k dielectric material that provides the bottom cladding dielectric material layer 14 can be compositionally the same as, or compositionally different from, the low-k dielectric material that provides the top cladding dielectric material layer 18. The low-k dielectric material that provides the bottom cladding dielectric material layer 14 can be compositionally the same as, or compositionally different from the dielectric material that provides the first ILD material layer 10. Each of the bottom cladding dielectric material layer 14 and the top cladding dielectric material layer 18 can have a thickness in a range from 10 nm to 70 nm; although other thicknesses for the bottom and top cladding dielectric material layers 14, 18 are contemplated and can be employed in the present application. The bottom cladding dielectric material layer 14 and the top cladding dielectric material layer 18 can be formed by one of the deposition processes mentioned above for forming the first ILD material layer 10.

In one embodiment of the present application, the bottom magnetic shield material-containing layer 16 is composed of a magnetic shield material that provides Faraday shielding for RF magnetic fields, such as but not limited to, above 100 kHz; such magnetic shield materials can be referred to as high RF magnetic field shield materials. Illustrative examples of high RF magnetic field shield materials that can be employed in the present application include, but are not limited to, Ti, TiN, Cu, Ta, TaN, W, Al, or AN. In some embodiments, a single high RF magnetic field shield material can be present in the bottom magnetic shield material-containing layer 16. In other embodiments, a multilayered stack of at least two high RF magnetic field shield materials (such as Ti/TiN or Ta/TaN) can be present in the bottom magnetic shield material-containing layer 16. While providing Faraday shielding, the high RF magnetic field shield materials are susceptible to static magnetic fields.

In another embodiment of the present application, the bottom magnetic shield material-containing layer 16 is composed of a magnetic shield material that is composed of a μ-metal that has a high magnetic permeability, such as but not limited to, from 80,000 Oersteds to 100,000 Oersteds; such magnetic shield materials can be referred to herein as high permeability magnetic shield materials. Illustrative examples of high permeability magnetic shield materials that can be employed in the present application include, but are not limited to, Ni—Fe alloys, NiFeMo alloys, NiFeCuCr alloys, or NiFeCuMo alloys. In some embodiments, a single high permeability magnetic shield material can be present in the bottom magnetic shield material-containing layer 16. In other embodiments, a multilayered stack of at least two high permeability magnetic shield materials can be present in the bottom magnetic shield material-containing layer 16. The high permeability magnetic shield materials provide shielding against static or low-frequency (such as, but not limited to, 100 Hz or less) magnetic fields.

In a further embodiment of the present application, the bottom magnetic shield material-containing layer 16 is composed of a magnetic shield material that is composed of a very high-temperature superconductor material which is capable of expelling magnetic flux fields in the superconducting regime (Meissner Effect). Illustrative examples of superconducting materials that can be employed in the present application include, but are not limited to, Al, Pd, $TaSi_2$, SiC:B, Nb, V, Tc, NbTi, $Nb_3Sn$, FCC (face-center cubic) C:B, FCC Si:B, or cuprate-perovskite. In some embodiments, a single superconductor material can be present in the bottom magnetic shield material-containing layer 16. In other embodiments, a multilayered stack of at least two superconductor materials can be present in the bottom magnetic shield material-containing layer 16.

In some embodiments of the present application, the bottom magnetic shield material-containing layer 16 can include a multilayered stack including at least one high RF magnetic field shield material, as defined above, and at least one high permeability magnetic shield material, as defined above; a multilayered stack including at least one high RF magnetic field shield material, as defined, and a superconducting material, as defined above; a multilayered stack including at least one high permeability magnetic shield material, as defined above, and at least one superconducting material, as defined above; or a multilayered stack including at least one high RF magnetic field shield material, as defined, at least one high permeability magnetic shield material, as defined above, and at least one superconducting material, as defined above. In one example, a multilayered stack of Ti and a Ni—Fe alloy can be used so as to provide a combination of shielding against high frequency RF magnetic fields, and shielding against static or low frequency magnetic fields.

The bottom magnetic shield material-containing layer 16 can be formed by a deposition process such as, for example, CVD, PECVD, PVD, sputtering, platting or any combination thereof. The bottom magnetic shield material-containing layer 16 can have a thickness from 5 nm to 30 nm; although other thicknesses for the bottom magnetic shield material-containing layer 16 are contemplated and can be used herein.

Referring now to FIG. 4, there is illustrated the exemplary structure of FIG. 3 after forming a plurality of openings 20 in the magnetic shield-containing material stack, wherein each opening 20 physically exposes a surface of one of the first electrically conductive structures 12 embedded in the first ILD material layer 10. The openings 20 can be formed by lithography and etching. Each of the openings 20 has a dimension (i.e., width) that is typically equal to, or less than, the dimension (i.e., width) of the underlying first electrically conductive structure 12.

Referring now to FIG. 5, there is illustrated the exemplary structure of FIG. 4 after forming a first conformal dielectric material layer 22L on a topmost surface of the magnetic shield-containing material stack 14/16/18 and in each of the openings 20. As used herein, the term "conformal layer" denotes that a material layer has a vertical thickness along horizontal surfaces that is substantially the same (i.e., within ±5%) as the lateral thickness along vertical surfaces.

The conformal dielectric material layer 22L can be composed of a low-k dielectric material as defined herein. Illustrative examples of low-k dielectric materials that can be employed as the conformal dielectric material layer 22L include, but are not limited to, $SiO_2$, SiOC, SiOCN or SiBCN. The low-k dielectric material that provides conformal dielectric material layer 22L is typically, but necessarily always, compositionally different from at least the low-k dielectric material of the top cladding dielectric material layer 18.

The conformal dielectric material layer 22L can be formed by a conformal deposition process, including but not limited to, ALD, CVD, PECVD or PVD. The conformal dielectric material layer 22L can have a thickness from 1 nm to 10 nm, although lesser and greater thicknesses can also be employed provided that the conformal dielectric material layer 22L does not fill in the entire volume of the openings 20.

Referring now to FIG. 6, there is illustrated the exemplary structure of FIG. 5 after performing an anisotropic spacer etch on the first conformal dielectric material layer 22L to provide a bottom sidewall spacer 22 in each of the openings 20. The anisotropic spacer etch removes the first conformal dielectric material layer 22L from all horizontal surfaces of the structure, while leaving the first conformal dielectric material layer 22L along sidewalls of each of the openings 20. An example of an anisotropic spacer etch that can be employed in the present application, is a reactive ion etch. The bottom sidewall spacer 22 is pillar shaped and can have a topmost surface that is coplanar with a topmost surface of the top cladding dielectric material layer 18. The bottom sidewall spacer 22 the bottom electrode 24 that is subsequently formed in each of the openings 20 from the bottom magnetic shield material-containing layer 16.

Referring now to FIG. 7, there is illustrated the exemplary structure of FIG. 6 after forming a bottom electrode 24 in a remaining volume of each opening 20. Each bottom electrode 24 is composed of conductive electrode material including, but not limited to, Al, Ta, TaN, Ti, TiN, Ru, RuN, RuTa, RuTaN, Co, CoWP, CoN, W, WN or multilayered stacks thereof.

Each bottom electrode 24 can be formed by depositing the conductive electrode material within at least the remaining volume of each opening 20. In some embodiments, a planarization process such as, for example, CMP, can be employed to remove the conductive electrode material from a topmost surface of both the bottom sidewall spacer 22 and the top cladding dielectric material layer 18. The depositing of the bottom electrode can include, for example, CVD, PECVD, PVD, sputtering or platting. In some embodiments, a reflow anneal can follow the deposition of the conductive electrode material that provides the bottom electrodes 24.

Each bottom electrode 24 contacts a surface of one of the underlying first electrically conductive structures 12. In some embodiments, each bottom electrode 24 has a topmost surface that is coplanar with a topmost surface of both the bottom sidewall spacer 22 and the top cladding dielectric material layer 18. As stated above, each bottom electrode 24 is isolated, and thus spaced apart from the bottom magnetic shield material-containing layer 16 by the bottom sidewall spacer 22.

Figure 8:
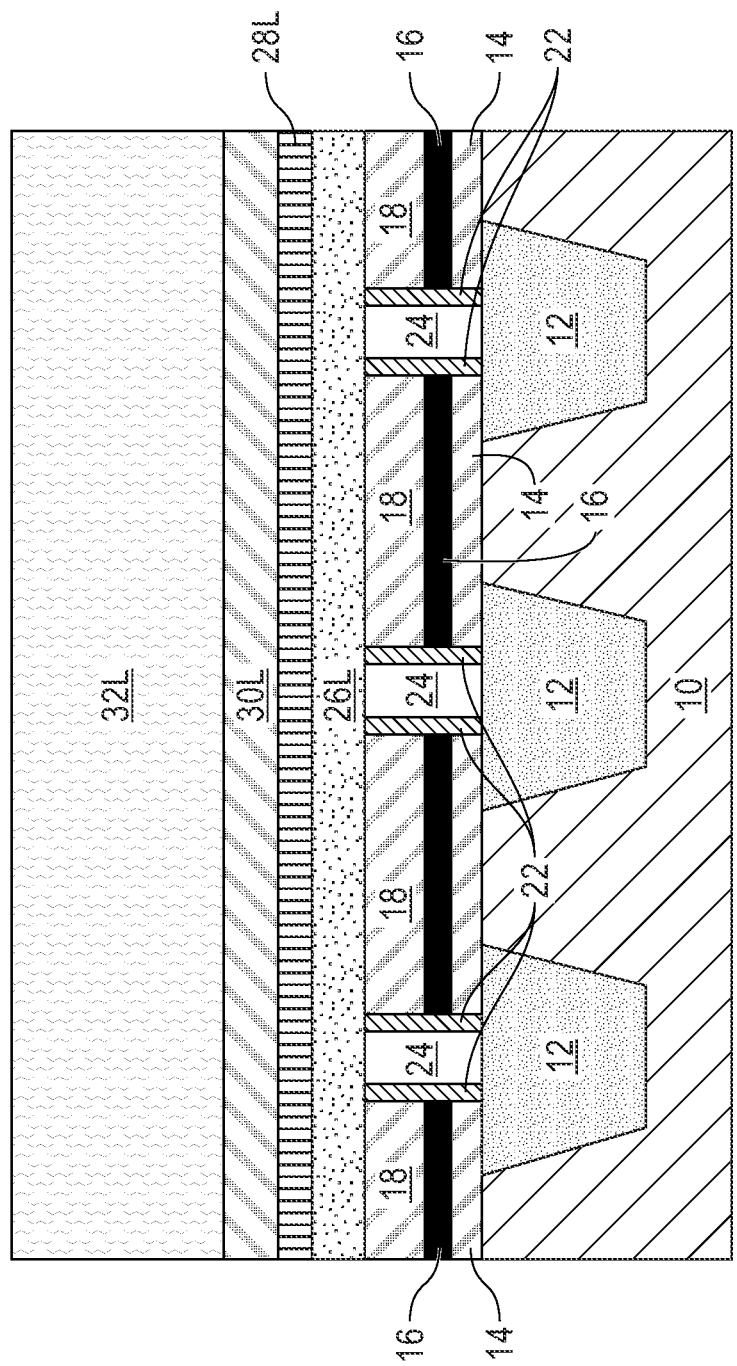
FIG. 8 is a cross sectional view of the exemplary structure of FIG. 7 after forming an MTJ-containing stack on the magnetic shield-containing material stack, and on each of the bottom electrodes.

Referring now to FIG. 8, there is illustrated the exemplary structure of FIG. 7 after forming an MTJ-containing stack 26L/28L/30L/32L on the magnetic shield-containing material stack 14/16/18 and each of the bottom electrodes 24. The MTJ-containing stack 26L/28L/30L/32L can include at least blanket layers of the following materials: a magnetic pinned material, a tunnel barrier material, a magnetic free material, and a conductive electrode material.

In some embodiments, the MTJ-containing stack 26L/28L/30L/32L (and as is shown in FIG. 8) is a bottom pinned MTJ-containing stack that includes, from bottom to top, a blanket layer of magnetic pinned material 26L, a blanket layer of tunnel barrier material 28L, a blanket layer of magnetic free material 30L, and a blanket layer of top conductive electrode material 32L. An optional blanket layer of metal seed material (not shown) can also be present in the bottom MTJ-containing stack. In the bottom pinned MTJ-containing stack, the optional blanket layer of metal seed material is formed beneath the blanket layer of magnetic pinned material 26L. The bottom pinned MTJ-containing stack can also include a blanket layer of non-magnetic spacer material (not shown) located on the blanket layer of magnetic free material 30L, a second blanket layer of magnetic free material (not shown) located on the blanket layer of non-magnetic spacer material, and/or a blanket layer of MTJ cap material (not shown) located on the blanket layer of magnetic free material 30L or on the second blanket layer of magnetic free material.

In other embodiments, the MTJ-containing stack (not shown but can easily be deduced by flipping the position of the blanket layer of magnetic pinned material 26L and the blanket layer of magnetic free material 30L) is a top pinned MTJ-containing stack that includes, from bottom to top, a blanket layer of magnetic free material 30L, a blanket layer of tunnel barrier material 28L, a blanket layer of magnetic pinned material 26L, and a blanket layer of top conductive electrode material 32L. In such an embodiment, the top pinned MTJ-containing stack can also include an optional blanket layer of metal seed material located beneath the blanket layer of magnetic free material 30L, a blanket layer of non-magnetic spacer material located on the blanket layer of magnetic free material 30L, a second blanket layer of magnetic free material located on the blanket layer of non-magnetic spacer material, and/or a blanket layer of MTJ cap material located on the blanket layer of magnetic pinned material 26L.

The various blanket layers of materials of the MTJ-containing stack can be formed by utilizing one or more deposition processes such as, for example, sputtering, plasma enhanced atomic layer deposition (PEALD), PECVD or PVD.

The optional blanket layer of metal seed material can be composed of Ta, TaN, Pt, Pd, Ni, Rh, Ir, Re or alloys and multilayers thereof. In one example, the optional blanket layer of metal seed material is composed of Pt.

The blanket layer of magnetic pinned material 26L has a fixed magnetization. The blanket layer of magnetic pinned material 26L can be composed of a metal or metal alloy (or a stack thereof) that includes one or more metals exhibiting high spin polarization. In alternative embodiments, exemplary metals for the formation of the blanket layer of magnetic pinned material 26L include iron, nickel, cobalt, chromium, boron, or manganese. Exemplary metal alloys can include the metals exemplified by the above. In another embodiment, the blanket layer of magnetic pinned material 26L can be a multilayer arrangement having (1) a high spin polarization region formed from of a metal and/or metal alloy using the metals mentioned above, and (2) a region constructed of a material or materials that exhibit strong perpendicular magnetic anisotropy (strong PMA). Exemplary materials with strong PMA that can be used include a metal such as cobalt, nickel, platinum, palladium, iridium, or ruthenium, and can be arranged as alternating layers. The strong PMA region can also include alloys that exhibit strong PMA, with exemplary alloys including cobalt-iron-terbium, cobalt-iron-gadolinium, cobalt-chromium-platinum, cobalt-platinum, cobalt-palladium, iron-platinum, and/or iron-palladium. The alloys can be arranged as alternating layers. In one embodiment, combinations of these materials and regions can also be employed as the blanket layer of magnetic pinned material 26L.

The blanket layer of tunnel barrier material 28L is composed of an insulator material and is formed at such a thickness as to provide an appropriate tunneling resistance. Exemplary materials for the blanket layer of tunnel barrier material 28L include magnesium oxide, aluminum oxide, and titanium oxide, or materials of higher electrical tunnel conductance, such as semiconductors or low-bandgap insulators.

The blanket layer of magnetic free material 30L can be composed of a magnetic material (or a stack of magnetic materials) with a magnetization that can be changed in orientation relative to the magnetization orientation of the magnetic pinned layer. Exemplary magnetic materials for the blanket layer of magnetic free material 30L include alloys and/or multilayers of cobalt, iron, alloys of cobalt-iron, nickel, alloys of nickel-iron, and alloys of cobalt-iron-boron.

If present, the blanket layer of non-magnetic metallic spacer material is composed of a non-magnetic metal or metal alloy that allows magnetic information to be transferred therethrough and also permits the two magnetic free layers to couple together magnetically, so that in equilibrium the first and second magnetic free layers are always parallel. The non-magnetic metallic spacer material allows for spin torque switching between a first blanket layer of magnetic free material (i.e., 30L) and a second blanket layer of magnetic free material (not shown).

If present, the second blanket layer of magnetic free material can include one of the magnetic materials mentioned above for blanket layer of magnetic free material 30L. In one embodiment, the second blanket layer of magnetic free material is composed of a same magnetic material as the blanket layer of magnetic free material 30L. In another embodiment, the second blanket layer of magnetic free material is composed of a magnetic material that is compositionally different from the blanket layer of magnetic free material 30L.

If present, the blanket layer of MTJ cap material can be composed of Nb, NbN, W, WN, Ta, TaN, Ti, TiN, Ru, Mo, Cr, V, Pd, Pt, Rh, Sc, Al or other high melting point metals or conductive metal nitrides. The blanket layer of MTJ cap material can have a thickness from 2 nm to 25 nm; other thicknesses are possible and can be used in the present application as the thickness of the blanket layer of MTJ cap material.

The blanket layer of top conductive electrode material 32L, which can function as a hard mask in a subsequent patterning process, can be composed of a conductive metal-containing material such as, for example, Ta, TaN, Ti, TiN, Ru, RuN, RuTa, RuTaN, Co, CoWP, CoN, W, WN or any combination thereof. In one embodiment of the present application, the blanket layer of top conductive electrode material 32L is composed of Ti/TiN. In the present application, the blanket layer of top conductive electrode material 32L can have a thickness that is from 50 nm to 500 nm; although other thicknesses are possible and can be used as the thickness of the blanket layer of top conductive electrode material 32L.

Figure 9:
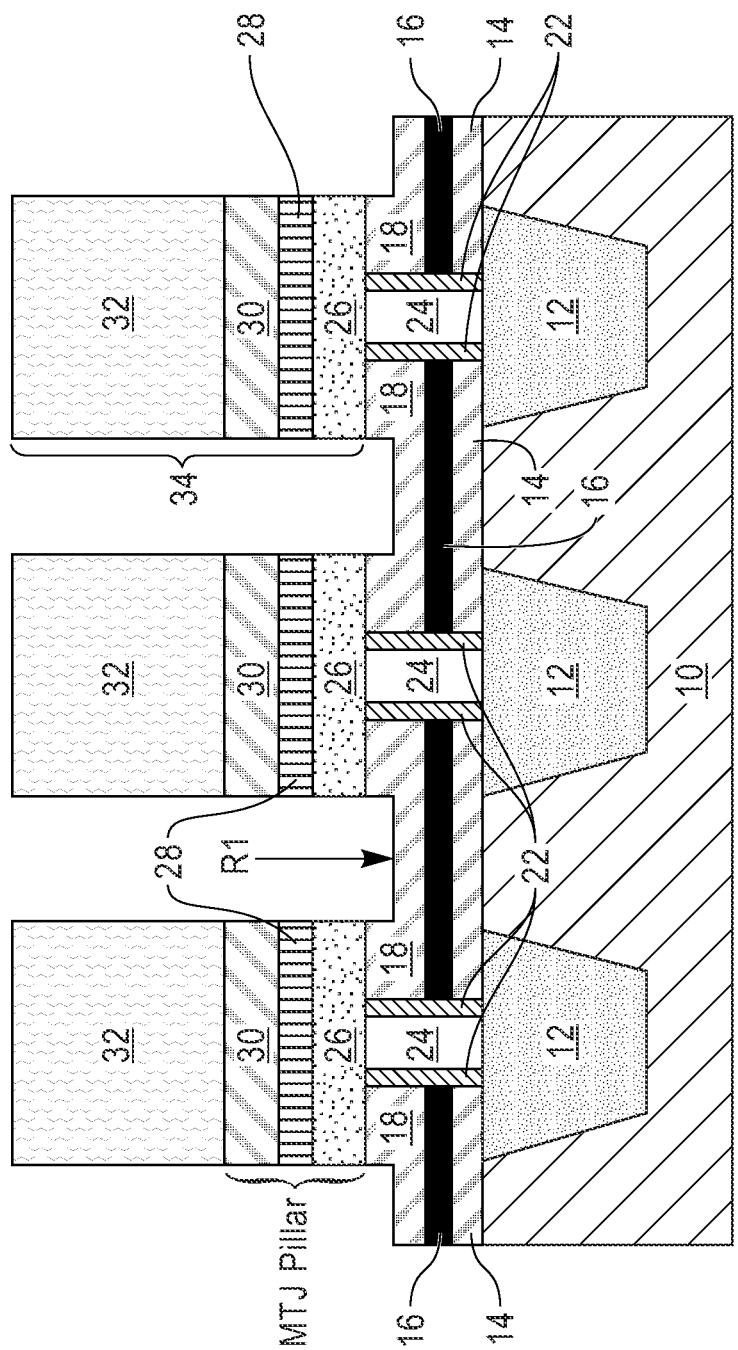
FIG. 9 is a cross sectional view of the exemplary structure of FIG. 8 after patterning the MTJ-containing stack to provide a plurality of MTJ-containing structures, wherein each MTJ-containing structure of the plurality of MTJ-containing structures contacts a surface of one of the underlying bottom electrodes.

Referring FIG. 9, there is illustrated the exemplary structure of FIG. 8 after patterning the MTJ-containing stack 26L/28L/30L/32L to provide a plurality of MTJ-containing structures 34, wherein each MTJ-containing structure 34 of the plurality of MTJ-containing structures contacts a surface of one of the underlying bottom electrodes 24.

The patterning of the MTJ-containing stack 26L/28L/30L/32L can include first forming a patterned mask (not shown) on a physically exposed surface of the blanket layer top conductive electrode material 32L. In some embodiments, the patterned mask can be composed of a photolithographic resist stack. In one embodiment, the photolithographic resist stack that provides the patterned mask can include a bottom organic layer, a middle inorganic layer and a top resist layer. The bottom organic layer of the photolithographic resist stack can include an organic planarization layer (OPL). The bottom organic layer of the photolithographic resist stack can include a spun-on organic layer such as, for example, a Near Frictionless Carbon (NFC), a diamond-like carbon, a thermosetting polyarylene ether or polyimide. The middle inorganic layer of the photolithographic resist stack can include any oxide layer such as, for example, a low temperature (e.g., less than or equal to 250° C.) CVD oxide, an oxide derived from TEOS (tetraethylorthosilicate), a silicon oxide, a silane oxide, or a Si-containing anti-reflection coating material (SiARC). The top resist layer of the photolithographic resist stack can be composed of a resist material that provides for high resolution lithography patterning. The photolithographic resist stack can be formed be first providing a utilizing a series of deposition processes including first spin-on coating of the bottom organic layer, second spin-on coating of the middle inorganic layer, and third spin-on coating of the top resist layer. After providing the photolithographic resist stack, the top resist layer is patterned by photolithography (i.e., exposing the top resist layer to a pattern of irradiation and then developing the exposed top resist layer), and thereafter the pattern provided to the top resist layer is transferred into the underlying layers of the photolithographic resist stack providing patterned mask. The transferring can include one or more etching processes.

In some embodiments, patterning can include first patterning the blanket layer of top conductive electrode material 32L utilizing a first etching process such as, for example, a reactive ion etch, utilizing the patterned mask described above as an etch mask. The remaining, i.e., non-patterned, portion of the blanket layer of top conductive electrode material 32L provides a top electrode 32. Each top electrode 32 can be cylindrical in shape; although other asymmetric shapes are possible and can be used in the present application as the shape of the top electrode 32. The critical dimension (CD) of each top electrode 32 can vary and is not critical in the present application.

After patterning the blanket layer top conductive electrode material 32L, the patterned mask is removed from atop each top electrode 32 that is formed utilizing conventional processes well-known to those skilled in the art. The patterning of the remaining blanket layers (i.e., blanket layers 26L/28L/30L) of the MTJ-containing stack is then performed utilizing an ion beam etch (IBE) in which each top electrode 32 is employed as a patterned mask. The non-patterned portions of the remaining blanket layers (i.e., layers 26L/28L/30L) of the MTJ-containing stack provide MTJ pillars that include, from bottom to top, a magnetic pinned layer 26 (i.e., a remaining, unetched portion of the blanket layer of magnetic pinned material 26L), a tunnel barrier layer 28 (i.e., a remaining, unetched portion of the blanket layer of tunnel barrier material 28), and a magnetic free layer 30 (i.e., a remaining, unetched portion of the blanket layer of magnetic free material). In another example (not shown), each MTJ pillar includes, from bottom to top, a magnetic free layer 30, a tunnel barrier layer 28, and a magnetic pinned layer 28. Each MTJ pillar 26/28/30 can include remaining portions of any other blanket layer that is present in the MTJ-containing stack.

Each MTJ pillar 26/28/30 can be cylindrical in shape; although other asymmetric shapes are possible and can be used in the present application as the shape of the MTJ pillar; the MTJ pillar 26/28/30 and the top electrode 32 that provide each MTJ-containing structure 34 have a same shape. The critical dimension (CD) of the MTJ pillar 26/28/30 can vary and is not critical in the present application. The CD of the MTJ pillar 26/28/30 is typically the same as the CD of the top electrode 32. As is shown, the CD of the MTJ pillar 26/28/30 and the CD of the top electrode 32 are greater than the CD of the underlying bottom electrode 24; thus, redeposition of bottom metal electrode particles onto the sidewall of the MTJ pillar 26/28/30 is avoided.

In the present application, each MTJ pillar 26/28/30 functions as a magnetic storage element. Each MTJ pillar 26/28/30 is in electrical contact with one of the bottom electrodes 24 and with one of the top electrodes 32. Collectively, the bottom electrode 24, the MTJ pillar 26/28/30, and the top electrode 32 provide a MRAM device within an MRAM array.

It should be noted that in some embodiments of the present application, the IBE process can also remove an upper portion of the top cladding dielectric material layer 18 so as to provide a recessed region, R1, in the top cladding dielectric material layer 18. The recessed region, R1, of the top cladding dielectric material layer 18 is found at a footprint of each MTJ-containing structure 34. Each MTJ-containing structure 34 is located on a non-recessed (i.e., pedestal) region of the top cladding dielectric material layer 18.

Figure 10:
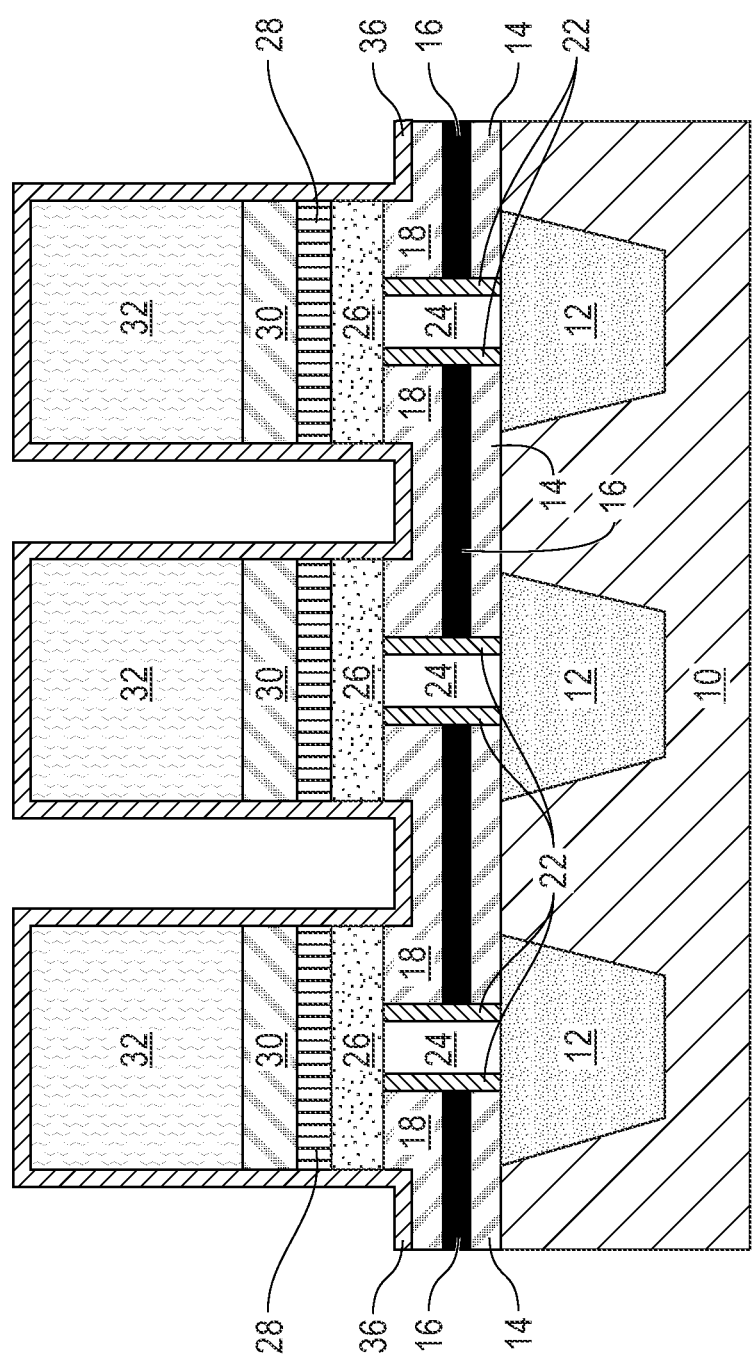
FIG. 10 is a cross sectional view of the exemplary structure of FIG. 9 after forming a dielectric liner on at least the physically exposed surfaces of each MTJ-containing structure of the plurality of MTJ-containing structures.

Referring now to FIG. 10, there is the exemplary structure of FIG. 9 after forming a dielectric liner 36 on at least the physically exposed surfaces of each MTJ-containing structure 34 of the plurality of MTJ-containing structures. Dielectric liner 36 encapsulates each MTJ-containing structure 34.

The dielectric liner 36 is composed of a dielectric material. In some embodiments, the dielectric material that provides the dielectric liner 36 can provide passivation to the each MTJ-containing structure 34. In one embodiment, the dielectric liner 36 is composed of silicon nitride. In another embodiment, the dielectric liner 36 can be composed of a dielectric material that contains atoms of silicon, carbon and hydrogen. In some embodiments, and in addition to atoms of carbon and hydrogen, the dielectric material that provides the dielectric liner 36 can include atoms of at least one of nitrogen and oxygen. In other embodiments, and in addition to atoms of silicon, nitrogen, carbon and hydrogen, the dielectric material that provides the dielectric liner 36 can include atoms of boron. In one example, the dielectric liner 36 can be composed of an nBLOK dielectric material that contains atoms of silicon, carbon, hydrogen, nitrogen and oxygen. In alternative example, the dielectric liner 36 can be composed of a SiBCN dielectric material that contains atoms of silicon, boron, carbon, hydrogen, and nitrogen.

The dielectric liner 36 can be formed utilizing a deposition process such as, for example, CVD, PECVD, or PVD. The dielectric liner 36 can have a thickness from 10 nm to 200 nm. Other thicknesses are possible and can be employed as the thickness of the dielectric liner 36.

Figure 11:
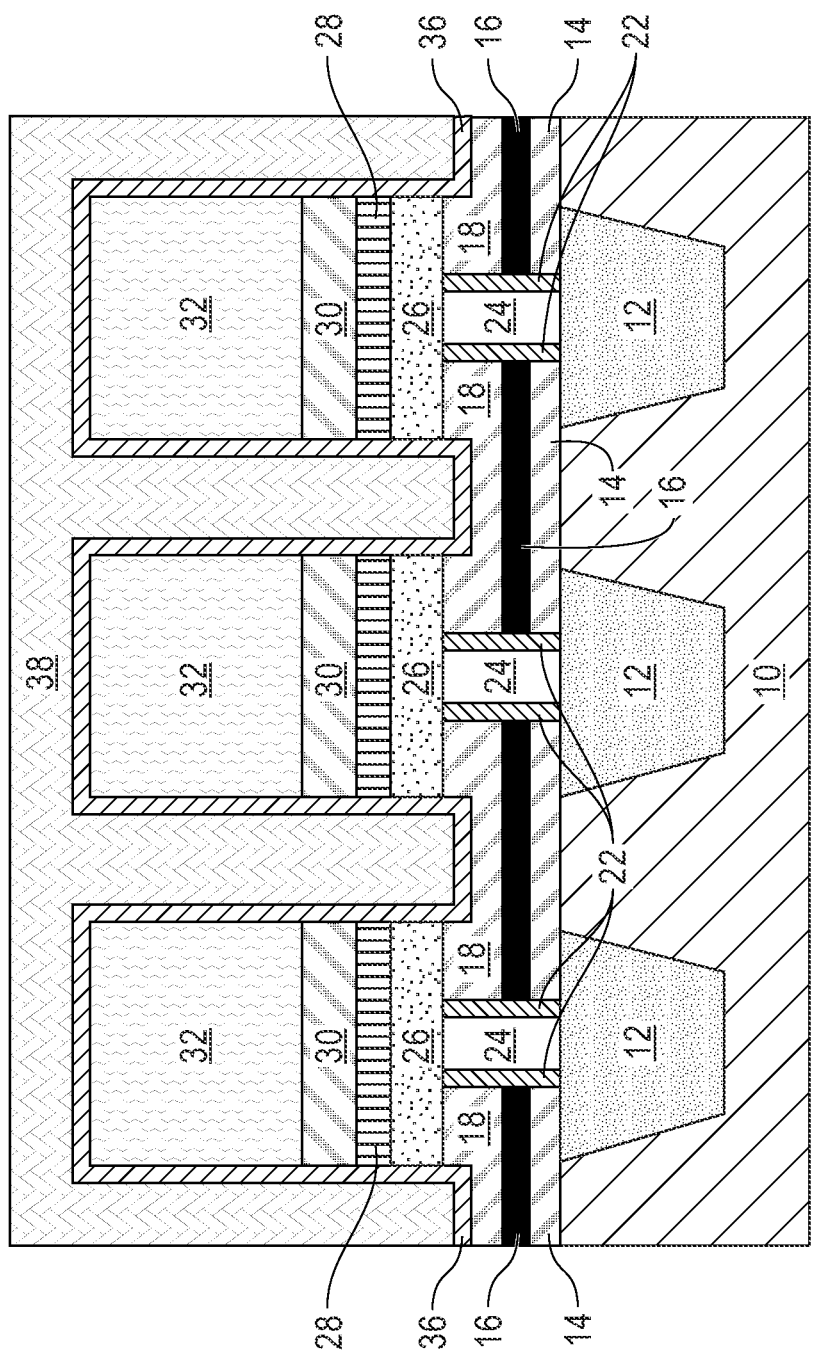
FIG. 11 is a cross sectional view of the exemplary structure of FIG. 10 after forming a second ILD material layer on the dielectric liner, wherein the second ILD material layer fills in the gaps that are located between each of the MTJ-containing structures and is present above each of the MTJ-containing structures.

Referring now to FIG. 11, there is illustrated the exemplary structure of FIG. 10 after forming a second ILD material layer 38 on the dielectric liner 36, wherein the second ILD material layer 38 fills in the gaps that are located between each of the MTJ-containing structures 34 and is present above each of the MTJ-containing structures 34.

The second ILD material layer 38 can include one of the dielectric materials mentioned above for the first ILD material layer 10. The dielectric material that provides the second ILD material layer 38 can be compositionally the same as, or compositionally different from, the dielectric material that provides the first ILD material layer 10. The second ILD material layer 38 can be formed utilizing one of the deposition processes mentioned above for forming the first ILD material layer 10. In some embodiments, a planarization process can follow the deposition of the dielectric material that provides the second ILD material layer 38.

Figure 12:
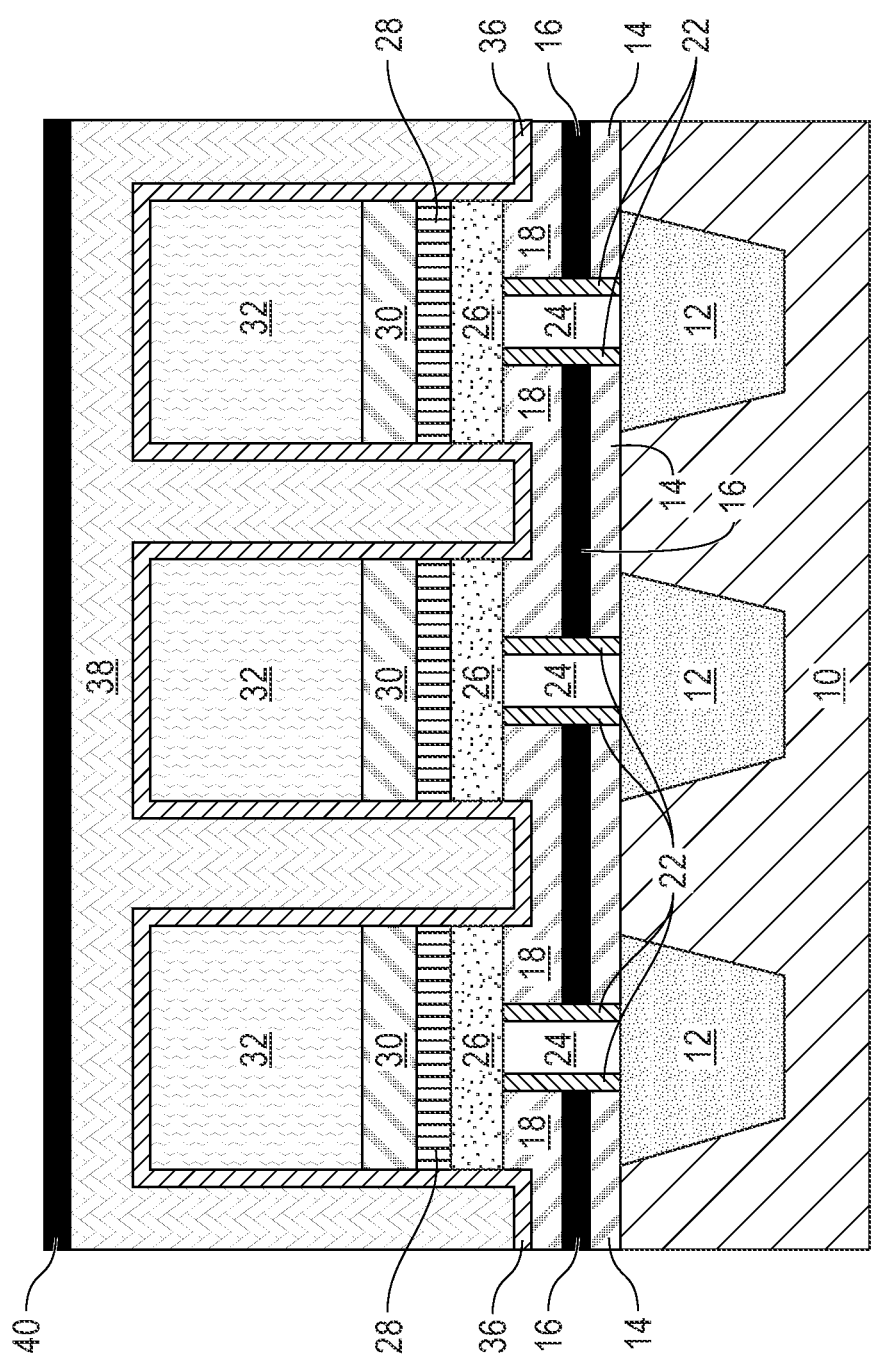
FIG. 12 is a cross sectional view of the exemplary structure of FIG. 11 after forming a top magnetic shield material-containing layer on a topmost surface of the second ILD material layer.

Referring now to FIG. 12, there is illustrated the exemplary structure of FIG. 11 after forming a top magnetic shield material-containing layer 40 on a topmost surface of the second ILD material layer 38. The top magnetic shield material-containing layer 40 can be composed of one of the magnetic shield materials mentioned above for the bottom magnetic shield material-containing layer 16. That is, the top magnetic shield material-containing layer 40 can be composed of a magnetic field shield material, as defined, a high permeability magnetic shield material, as defined above, and/or a superconducting material, as defined above. The top magnetic shield material-containing layer 40 can be composed of single magnetic shield material or it can be composed of a multilayered combination of magnetic shield materials. The magnetic shield material(s) that provides the top magnetic shield material-containing layer 40 can be compositionally the same as, or compositionally different from, the magnetic shield material that provides the bottom magnetic shield material-containing layer 16. Typically, however, the magnetic shield material that provides each of the bottom and top magnetic shield material-containing layer 16, 40 are compositionally the same.

Figure 13:
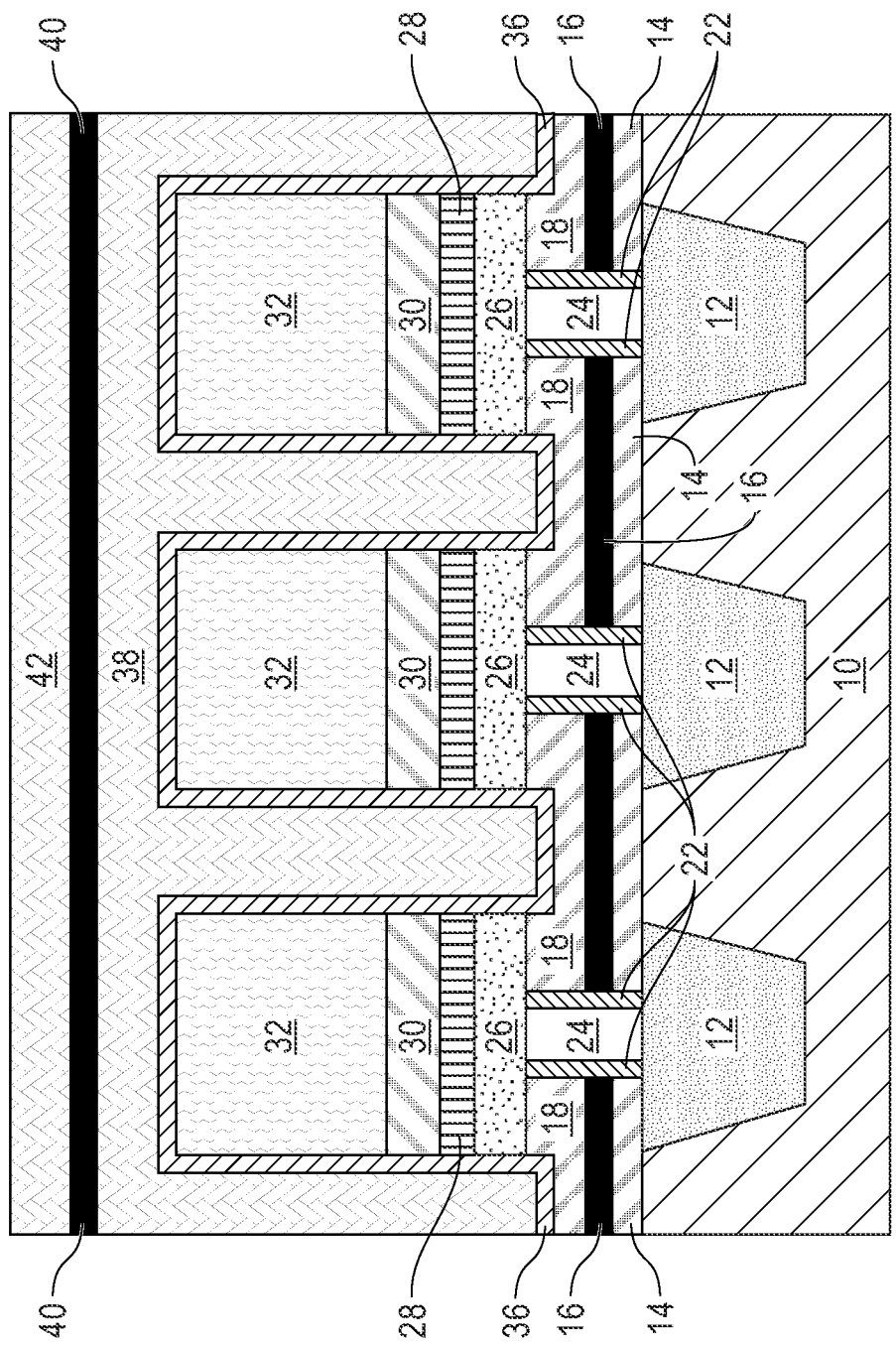
FIG. 13 is a cross sectional view of the exemplary structure of FIG. 12 after forming a third ILD material layer on the top magnetic shield material-containing layer.

Referring now to FIG. 13, there is illustrated the exemplary structure of FIG. 12 after forming a third ILD material layer 42 on the top magnetic shield material-containing layer 40. The third ILD material layer 42 can include one of the dielectric materials mentioned above for the first ILD material layer 10. The dielectric material that provides the third ILD material layer 42 can be compositionally the same as, or compositionally different from, the dielectric material that provides the first ILD material layer 10 and/or the second ILD material layer 38. The third ILD material layer 42 can be formed utilizing one of the deposition processes mentioned above for forming the first ILD material layer 10. In some embodiments, a planarization process can follow the deposition of the dielectric material that provides the third ILD material layer 42.

Figure 14:
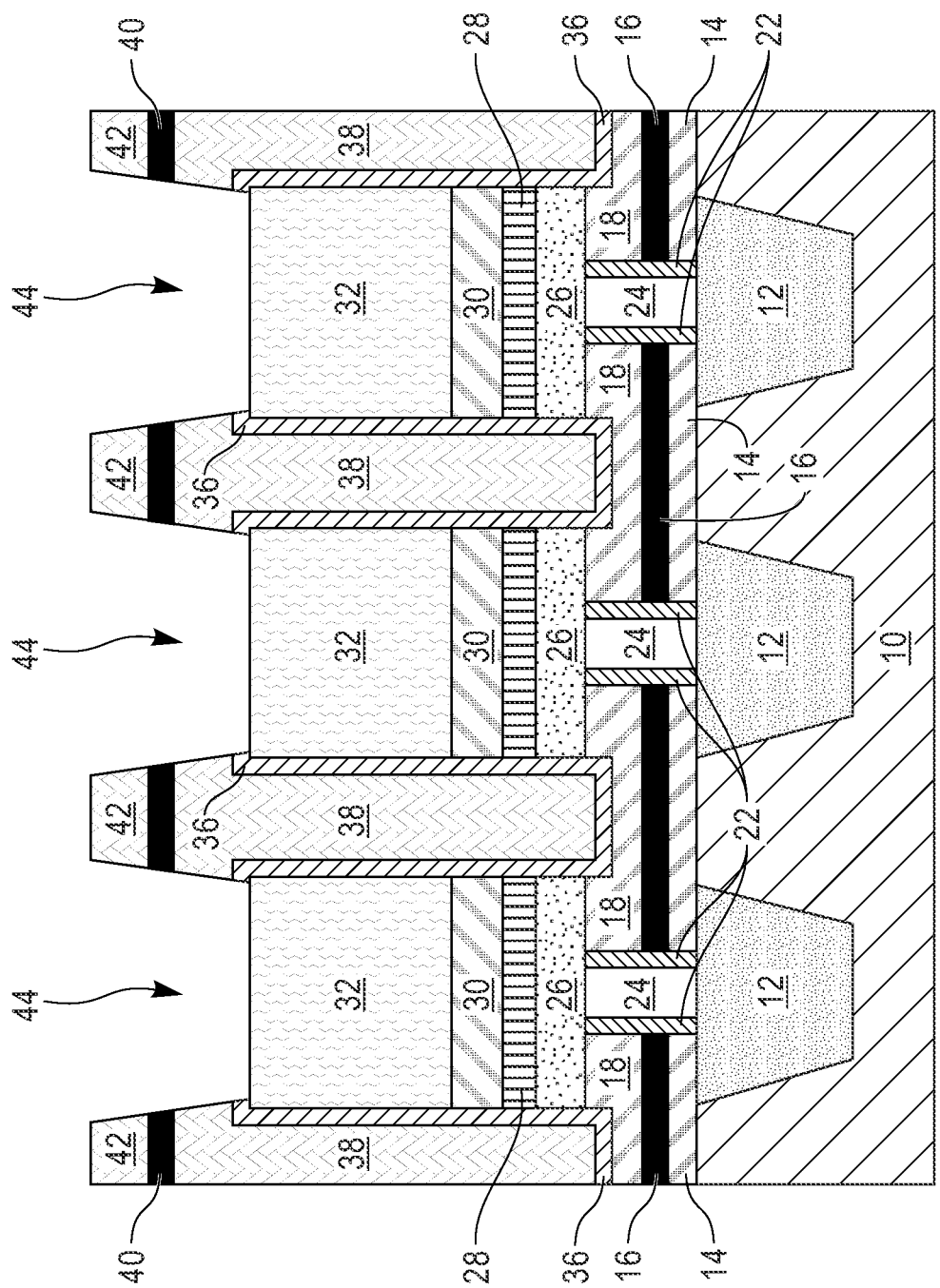
FIG. 14 is a cross sectional view of the exemplary structure of FIG. 13 after forming a plurality of contact openings through the third ILD material layer, the top magnetic shield material-containing layer, the second ILD material layer, and the dielectric liner, wherein each contact opening of the plurality of contact openings physically exposes a topmost surface of one of the underlying MTJ-containing structures.

Referring now to FIG. 14, there is illustrated the exemplary structure of FIG. 13 after forming a plurality of contact openings 44 through the third ILD material layer 42, the top magnetic shield material-containing layer 40, the second ILD material layer 38, and the dielectric liner 36, wherein each contact opening 44 of the plurality of contact openings physically exposes a topmost surface of one of the underlying MTJ-containing structures 34. The contact openings 44 can be formed by lithography and etching. The step used to form the contact openings 44 typically includes more than one etching process. After etching, the topmost surface of each top electrode 32 is physically exposed. Each contact opening 44 can have tapered sidewalls as shown in FIG. 14.

Figure 15:
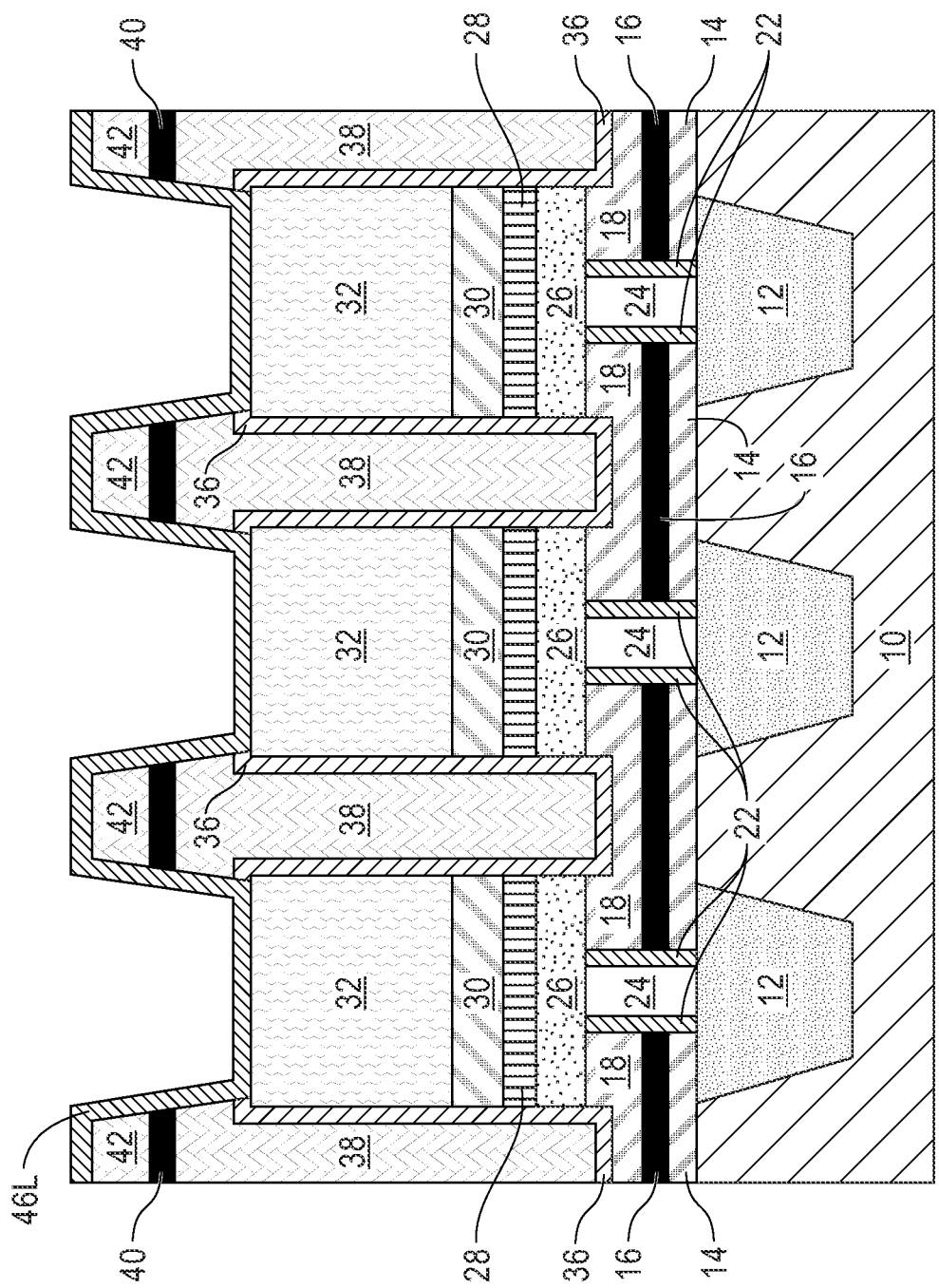
FIG. 15 is a cross sectional view of the exemplary structure of FIG. 14 after forming a second conformal dielectric material layer on a topmost surface of the third ILD material layer and in each of the contact openings.

Referring now to FIG. 15, there is illustrated the exemplary structure of FIG. 14 after forming a second conformal dielectric material layer 46L on a topmost surface of the third ILD material layer 42 and in each of the contact openings 44. Within each contact opening 44, the second conformal dielectric material layer 46L is present on physically exposed sidewalls of each of the third ILD material layer 42, the top magnetic shield material-containing layer 40 and the second ILD material layer 38 as well as on the physically exposed topmost surface of top electrode 32.

The second conformal dielectric material layer 46L is composed of one of the dielectric materials mentioned above for the first conformal dielectric material layer 22L. The dielectric material that provides the second conformal dielectric material layer 46L can be compositionally the same as, or compositionally different from, the dielectric material that provides the first conformal dielectric material layer 22L. The second conformal dielectric material layer 46L can be formed utilizing one of the deposition processes mentioned above in forming the first conformal dielectric material layer 22L. The second conformal dielectric material layer 46L can have a thickness within the thickness range mentioned above for the first conformal dielectric material layer 22L.

Figure 16:
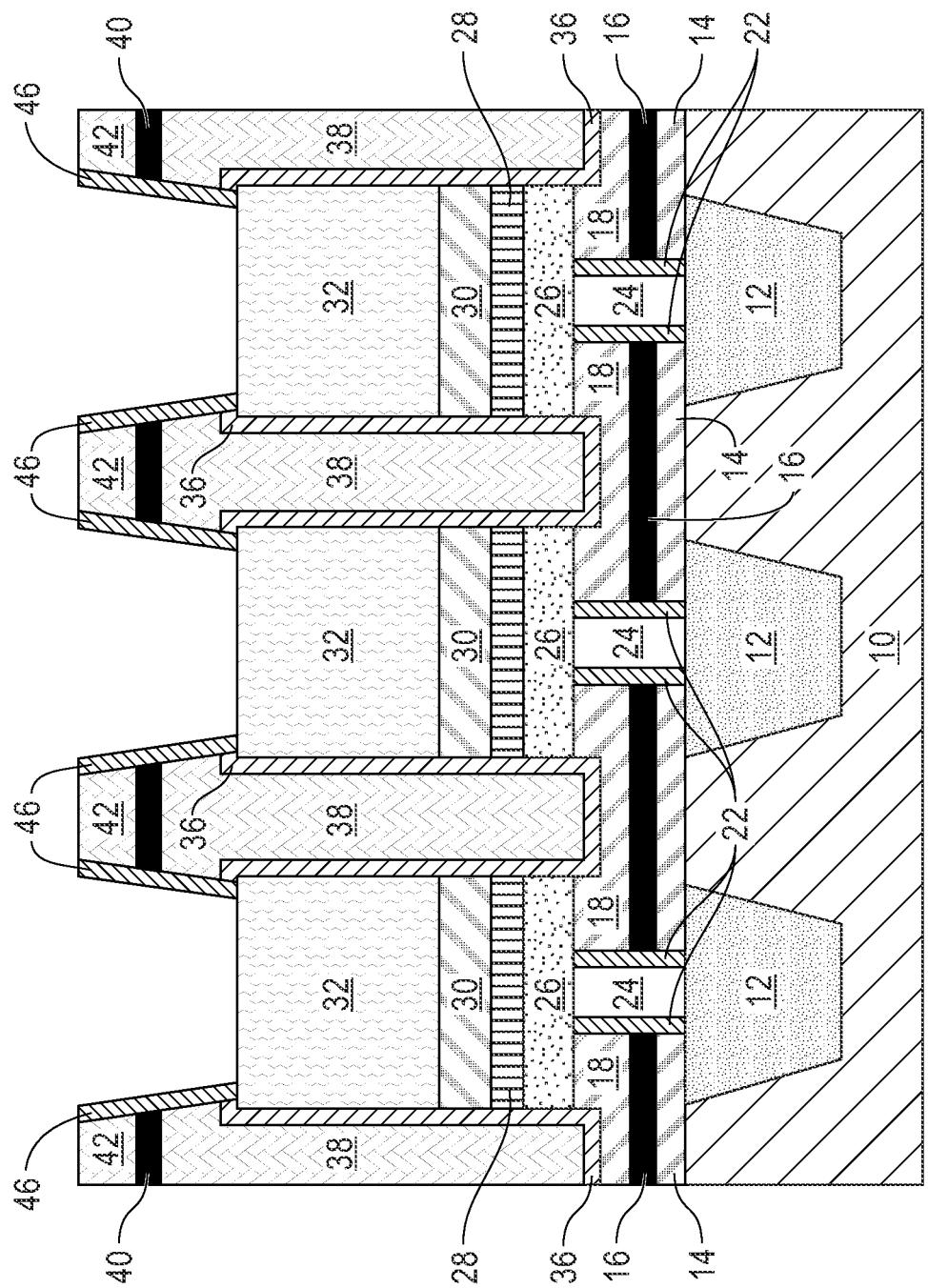
FIG. 16 is a cross sectional view of the exemplary structure of FIG. 15 after performing an anisotropic spacer etch on the second conformal dielectric material layer to provide a top sidewall spacer in each of the contact openings.

Referring now to FIG. 16, there is illustrated the exemplary structure of FIG. 15 after performing an anisotropic spacer etch on the second conformal dielectric material layer 46L to provide a top sidewall spacer 46 in each of the contact openings 44. The anisotropic spacer etch used to provide the top sidewall spacer 46 is the same as mentioned above for providing the bottom sidewall spacer 22. Within each contact opening 44, the top sidewall spacer 46 is present on physically exposed sidewalls of each of the third ILD material layer 42, the top magnetic shield material-containing layer 40 and the second ILD material layer 38.

Figure 17:
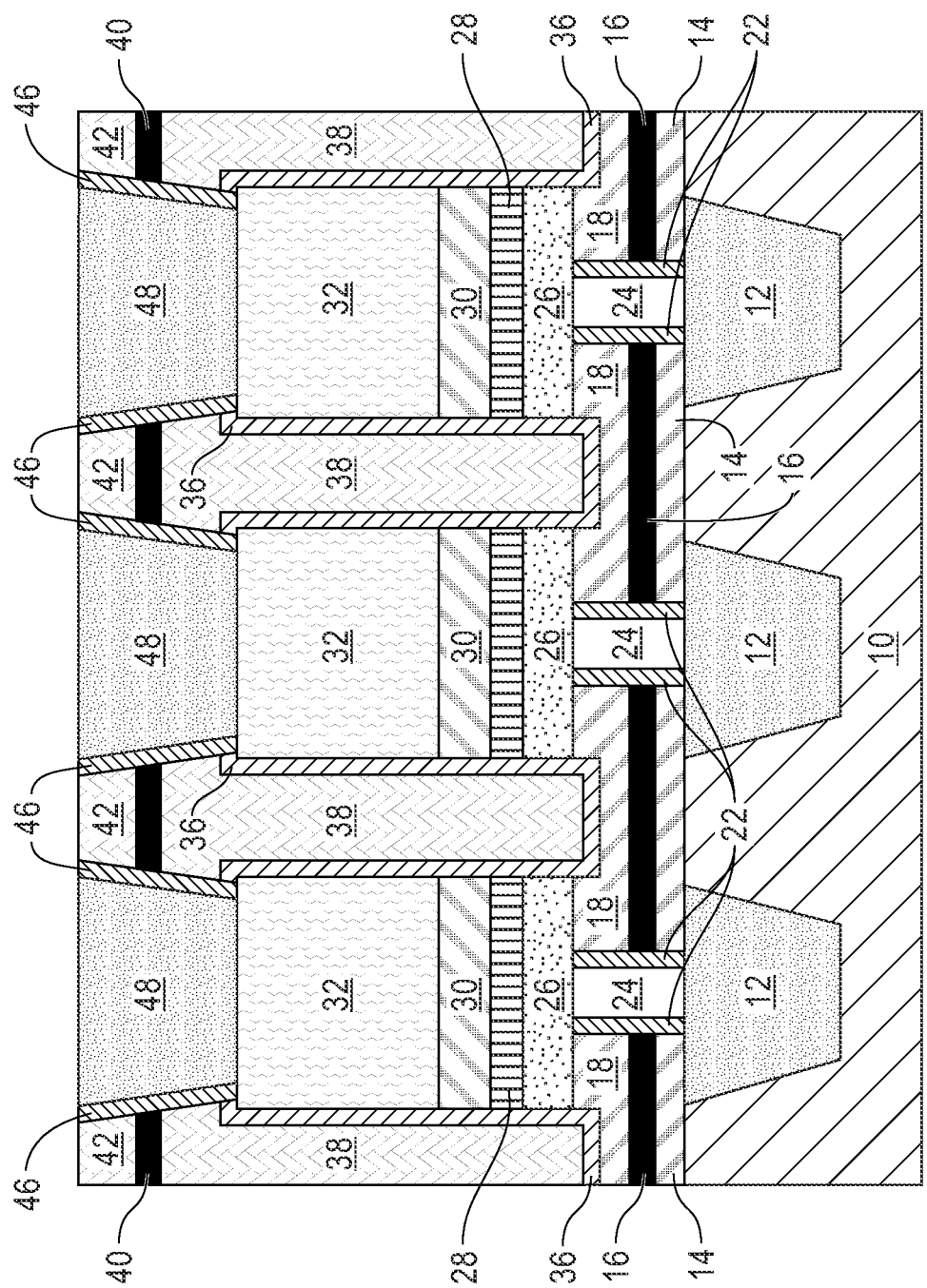
FIG. 17 is a cross sectional view of the exemplary structure of FIG. 16 after forming a second electrically conductive structure in a remaining volume of each of the contact openings.

Referring now to FIG. 17, there is illustrated the exemplary structure of FIG. 16 after forming a second electrically conductive structure 48 in a remaining volume of each of the contact openings 44. The second electrically conductive structures 48 can be composed of one of the electrically conductive materials mentioned above for the first electrically conductive structures 12. The electrically conductive material that provides the second electrically conductive structures 48 can be compositionally the same as, or compositionally different from, the electrically conductive material that provides the first electrically conductive structures 12.

The second electrically conductive structures 48 can be formed utilizing the technique mentioned above for forming the first electrically conductive structures 12, i.e., deposition of the electrically conductive material, followed by planarization. Although not shown, a diffusion barrier liner can be formed in each of the contact openings 44 utilizing the same technique mentioned above for forming a diffusion barrier liner between the first ILD material layer 10 and each first electrically conductive structure 12. Each second electrically conductive structure 48 has a topmost surface that is typically coplanar with a topmost surface of both the top sidewall spacer 46 and the third ILD material layer 38. In this embodiment of present application, the top sidewall spacer 46 isolates the second electrically conductive structures 48 from the top magnetic shield material-containing layer 40.

The exemplary structure shown in FIG. 17 represents an embodiment of the present application including bottom magnetic shield material-containing layer 16 and top magnetic shield material-containing layer 40 within an MRAM array including a plurality of MRAM devices (i.e., bottom electrode 24, MTJ pillar 26/28/30, and top electrode 32). In this embodiment of the present application, the bottom magnetic shield material-containing layer 16 and top magnetic shield material-containing layer 40 are not connected to each other. In this embodiment, the bottom magnetic shield material-containing layer 16 is located beneath the MTJ pillar 26/28/30 of each MRAM device, but above, the first electrically conductive structures 12 that are in electrical contact with the MRAM devices. The top magnetic shield material-containing layer 40 is located above each MRAM device, and laterally adjacent to, but not above or below, the second electrically conductive structures 48 that is also electrically connected with the MRAM devices.

Figure 18:
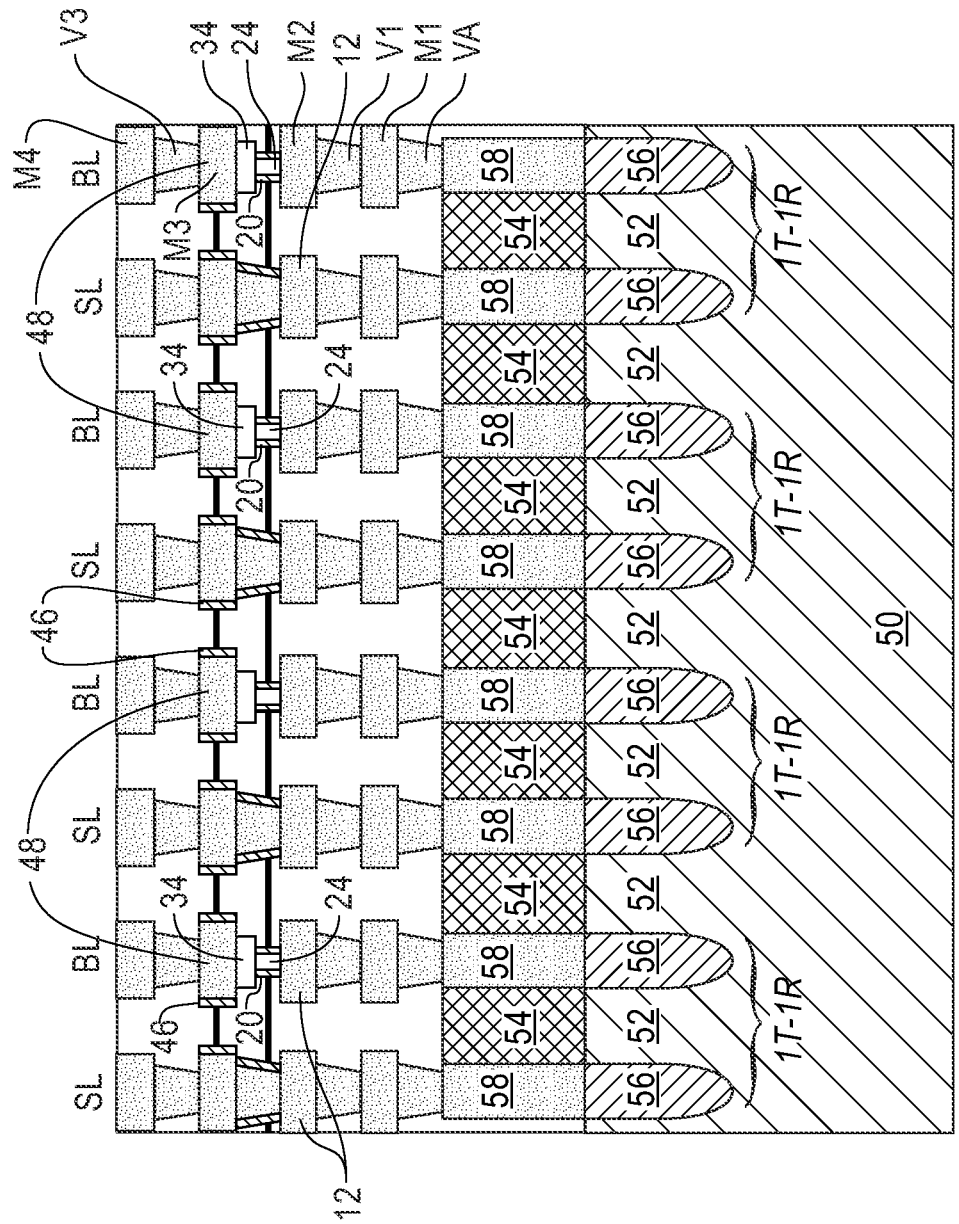
FIG. 18 is cross sectional view of an exemplary MRAM array architecture in accordance with one embodiment of the present application for embedded integration of bottom and top magnetic shield material-containing layers between M2 and M3 levels in which each source line and each bit line run upward through the bottom and top magnetic shield material-containing layers.

Referring now to FIG. 18, there is illustrated an exemplary MRAM array architecture in accordance with one embodiment of the present application for embedded integration of bottom and top magnetic shield material-containing layers 16, 40 between M2 and M3 levels in which each source line, SL, and each bit line, BL, run upward through the bottom and top magnetic shield material-containing layers 16, 40. Notably, FIG. 18 shows MRAM array architecture including a plurality of 1T-1R non-volatile memory devices located on surface of a semiconductor substrate 50. Each 1T-1R non-volatile memory device includes a driver transistor with a channel region 52 (as an active semiconductor material region) extending upwards from a surface of the semiconductor substrate 50, a functional gate structure 54, which form the word line, WL, of each 1T-1R non-volatile memory device, located on a surface of the semiconductor channel 52, and a source/drain region 56 located adjacent to each side of the semiconductor channel 52 and at a footprint of the functional gate structure 54. In some embodiments, the semiconductor channel 52 can have different geometries, e.g., planar, fin, and gate-all-around, and can be composed of different semiconductor materials, e.g., Si or SiGe. Each 1T-1R non-volatile memory device further includes a source/drain trench contact structure 58 contacting the source/drain regions 56 (source/drain regions 56 can be formed by epitaxial growth and thus can be referred to as source/drain epitaxy regions). Metal levels M1, M2, M3 and M4 are located above the functional gate structure 54. Each metal level, M1, M2, M3 and M4 includes electrically conductive structures and metal vias, V1, V2 and V3 embedded in ILD material layers; the metal vias V1, V2 and V3 electrically connect each electrically conductive structure in the metal levels, and metal via, VA, contacts M1 to the source/drain trench contact structure 58. In the exemplary embodiment, M2 is a first electrically conductive structure 12 that is embedded in ILD material layer. In FIGS. 18, 20 and 22-27 the various ILD material layers 10, 38, 42, etc. described previously are just labeled as ILD for simplicity.

Each 1T-1R non-volatile memory device includes a bottom electrode 24, an MTJ-containing structure 34, and a second electrically conductive structure 48 at the M3 level. As is shown, the bottom electrode 24 is isolated from the bottom magnetic shield material-containing layer 16 by bottom sidewall spacer 24 and the second electrically conductive structure 48 is isolated from the second magnetic shield material-containing layer 40 by top sidewall spacer 46. In the drawings, the MTJ-containing device 34 is embedded in an ILD material layer, and an upper portion of the second electrically conductive structure 48 is embedded in an ILD material layer. In the drawing, the top and bottom cladding dielectric layers that encase the bottom magnetic shield material-containing layer 16 are not shown for clarity.

Each 1T-1R non-volatile memory device includes a source line, SL, and a bit line, BL. Source line, SL, includes one of the source drain regions 56, source/drain contact structure 58, and the various metal levels, M1, M2, M3, M4 not including the MTJ-containing device 34. Note that the at the M3 level of the SL a top sidewall spacer 46 is present, and that a bottom sidewall spacer 24 is laterally adjacent V2. Thus, and in the SL, the M3 level is isolated from the top magnetic shield material-containing layer 40, and V2 is isolated from the bottom magnetic shield material-containing layer 16.

The bit line, BL, includes the other source drain regions 56, source/drain contact structure 58, and the various metal levels, M1, M2, M3, M4 including the MTJ-containing device 34.

Figure 19:
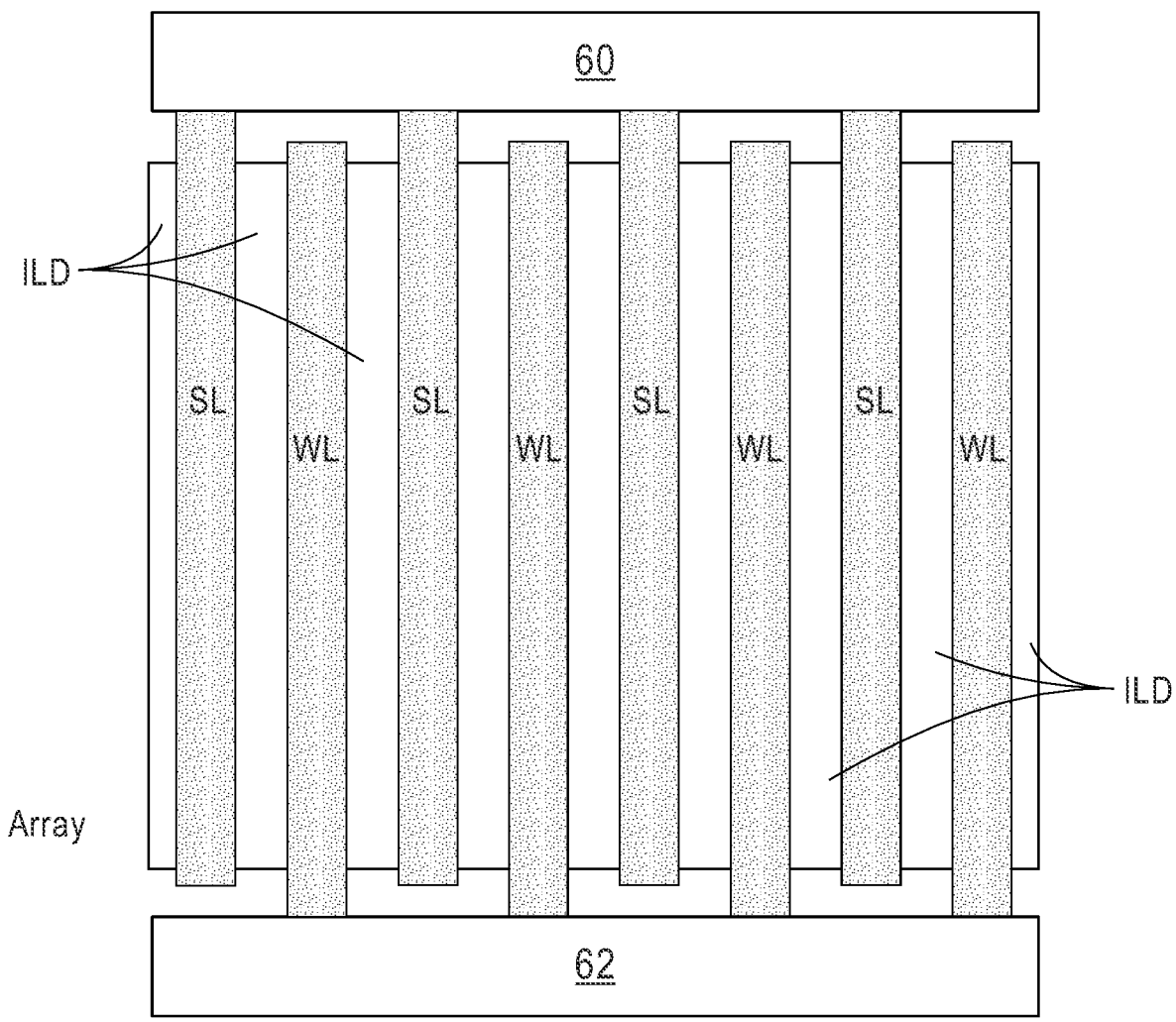
FIG. 19 is diagram showing the operation of the MRAM array architecture shown in FIG. 18.

Referring now to FIG. 19, there is illustrated a diagram showing the operation of the MRAM array architecture shown in FIG. 18. As is shown, each SL is connected to a first decoder 60, and each BL is connected a second decoder 62. The function of the decoders 60, 62 is to address targeted MRAM devices for Read and Write operations to ensure operation and synchronization of the MRAM array operation.

Figure 20:
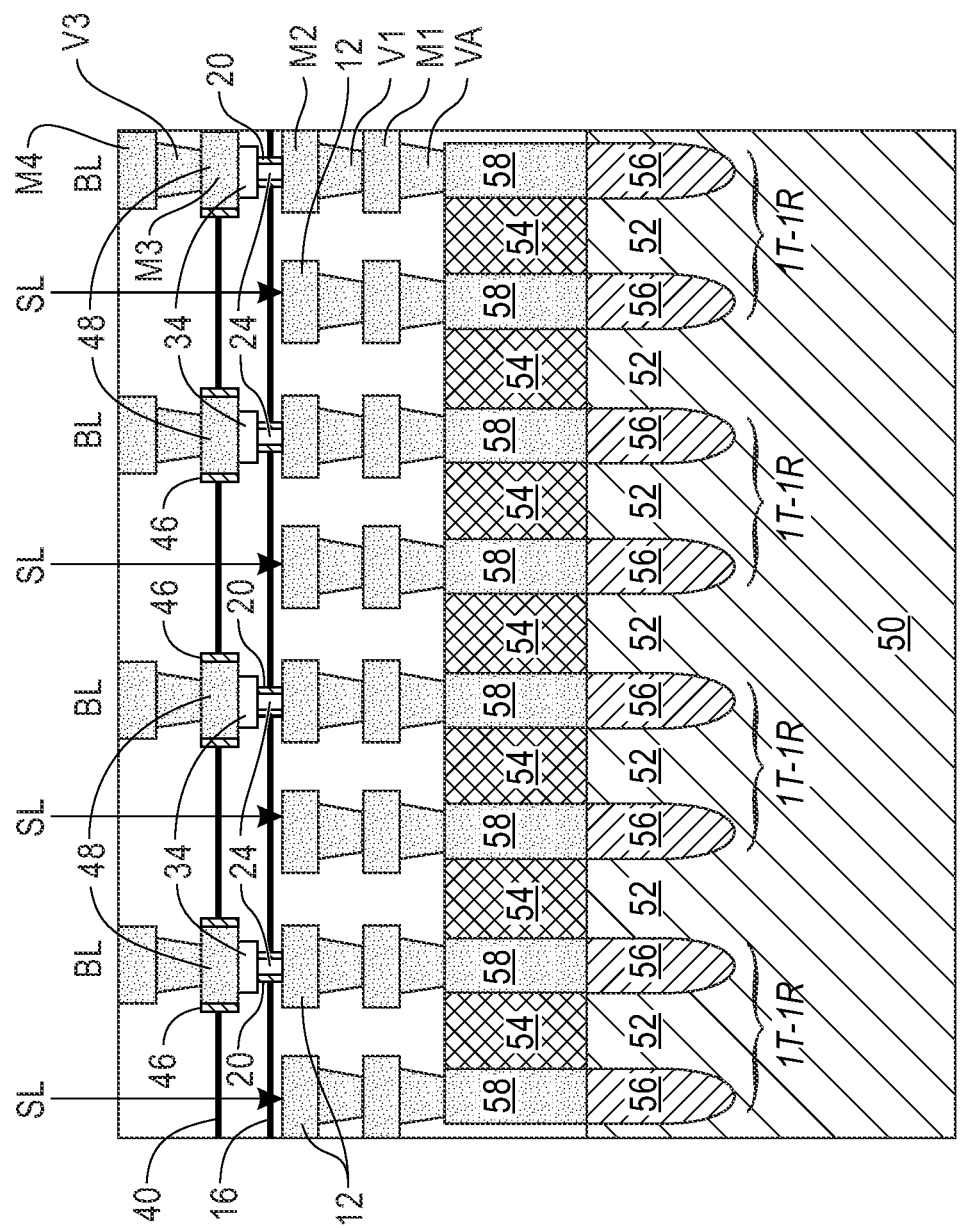
FIG. 20 is cross sectional view of another exemplary MRAM array architecture in accordance with another embodiment of the present application for embedded integration of bottom and top magnetic shield material-containing layers between M2 and M3 levels in which the each source line runs entirely below the bottom magnetic shield material-containing layer.

Referring now to FIG. 20, there is illustrated another exemplary MRAM array architecture in accordance with another embodiment of the present application for embedded integration of bottom and top magnetic shield material-containing layers 16, 20 between M2 and M3 levels in which each source line, SL, runs entirely below the bottom magnetic shield material-containing layer 16. The exemplary MRAM array architecture of FIG. 20 is similar to that described above for the exemplary MRAM array architecture of FIG. 18 except no metal level beyond M2 is present in the SL; like elements within FIGS. 18 and 20 are shown with like reference numerals. Thus, and since V3 is absent in the exemplary MRAM array architecture of FIG. 20, no bottom sidewall spacer 24 or top sidewall spacer 46 are present in the SL. The MRAM array architecture of FIG. 20 can be connected to first and second decoders as shown in FIG. 19.

Figure 21:
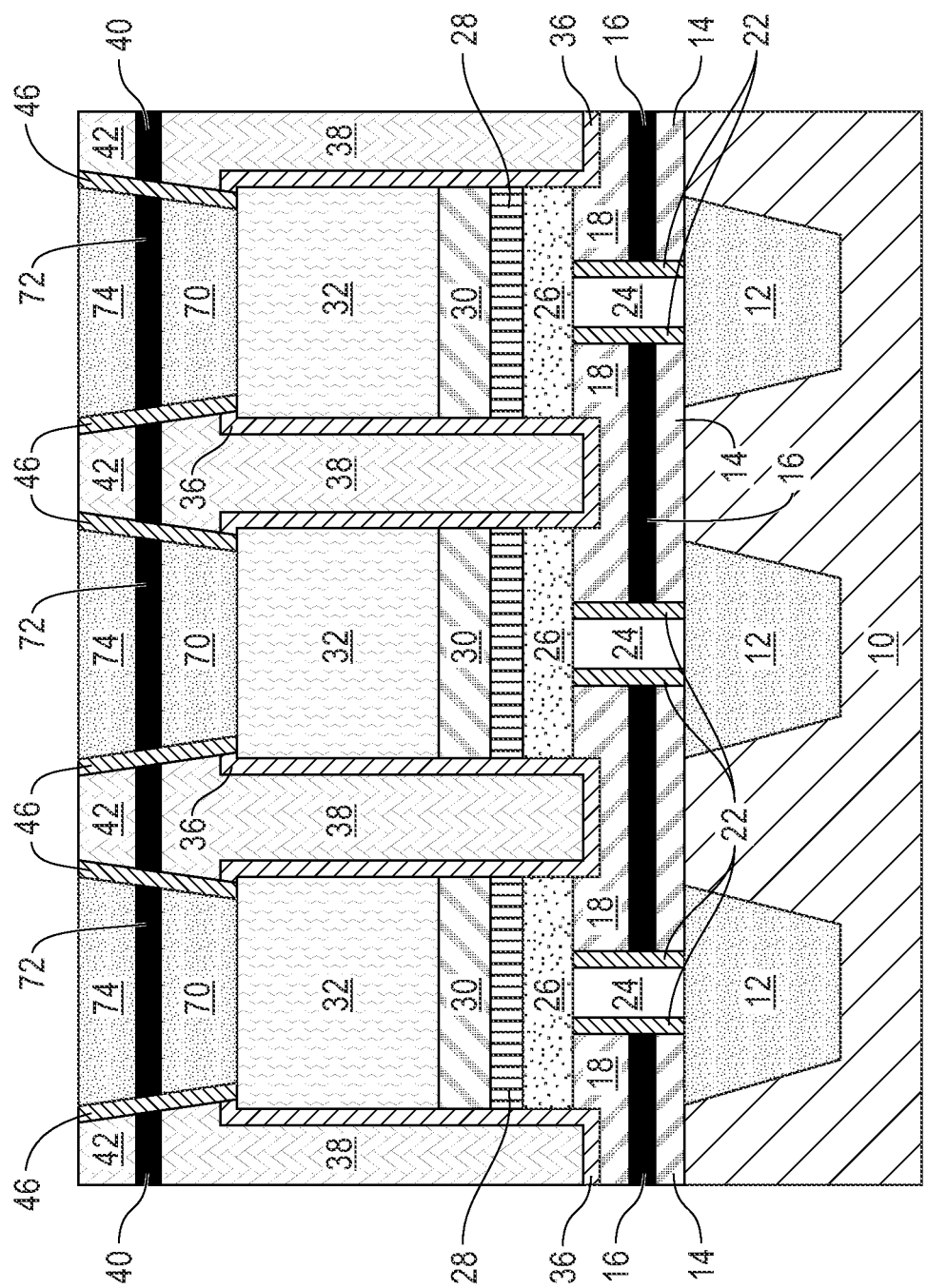
FIG. 21 is a cross sectional view of the exemplary structure of FIG. 16 after forming a stack of a lower second electrically conductive structure, an inter-via magnetic shield material-containing layer, and an upper second electrically conductive structure in a remaining volume of each of the contact openings in accordance with another embodiment of the present application.

Referring now to FIG. 21, there is illustrated exemplary structure of FIG. 16 after forming a stack of a lower second electrically conductive structure 70, an inter-via magnetic shield material-containing layer 72, and an upper second electrically conductive structure 74 in a remaining volume of each of the contact openings 44 in accordance with another embodiment of the present application.

The lower second electrically conductive structure 70 is composed of one of the electrically conductive materials mentioned above for the first electrically conductive structure 12. The electrically conductive structure that provides the lower second electrically conductive structure 70 can be composed of a compositionally same, or compositionally different, electrically conductive material as that which provides the first electrically conductive structure 12. The lower second electrically conductive structure 70 can be formed by deposition of an electrically conductive material, followed by performing a recess etching process. The lower second electrically conductive structure 70 is designed to have a thickness such that the topmost surface of the lower second electrically conductive structure 70 is coplanar with a topmost surface of the second ILD material layer 38.

The inter-via magnetic shield material-containing layer 72 is composed of one of the magnetic shield materials mentioned above for the bottom magnetic shield material-containing layer 16. The shielding material that provides the inter-via magnetic shield material-containing layer 72 is typically the same as the magnetic shielding material that provides the top magnetic shield material-containing layer 40. The inter-via magnetic shield material-containing layer 72 can be formed by deposition of a magnetic shield material, followed by performing a recess etching process. The inter-via magnetic shield material-containing layer 72 is designed to have a thickness such that the bottommost surface and topmost surface of the inter-via magnetic shield material-containing layer 72 are coplanar with a bottommost surface and a topmost surface, respectively, of the top magnetic shield material-containing layer 40.

The upper second electrically conductive structure 74 is composed of one of the electrically conductive materials mentioned above for the first electrically conductive structure 12. The electrically conductive structure that provides the upper second electrically conductive structure 74 can be composed of a compositionally same, or compositionally different, electrically conductive material as that which provides the first electrically conductive structure 12 and/or lower second electrically conductive structure 70. The upper second electrically conductive structure 74 can be formed by deposition of an electrically conductive material, followed by performing a planarization process. The upper second electrically conductive structure 74 is designed to have a thickness such that the topmost surface of the upper second electrically conductive structure 74 is coplanar with a topmost surface of the third ILD material layer 42.

The exemplary structure shown in FIG. 21 can be used in any of the MRAM array architecture shown in FIGS. 18 and 20, as well as 27 below.

Figure 22:
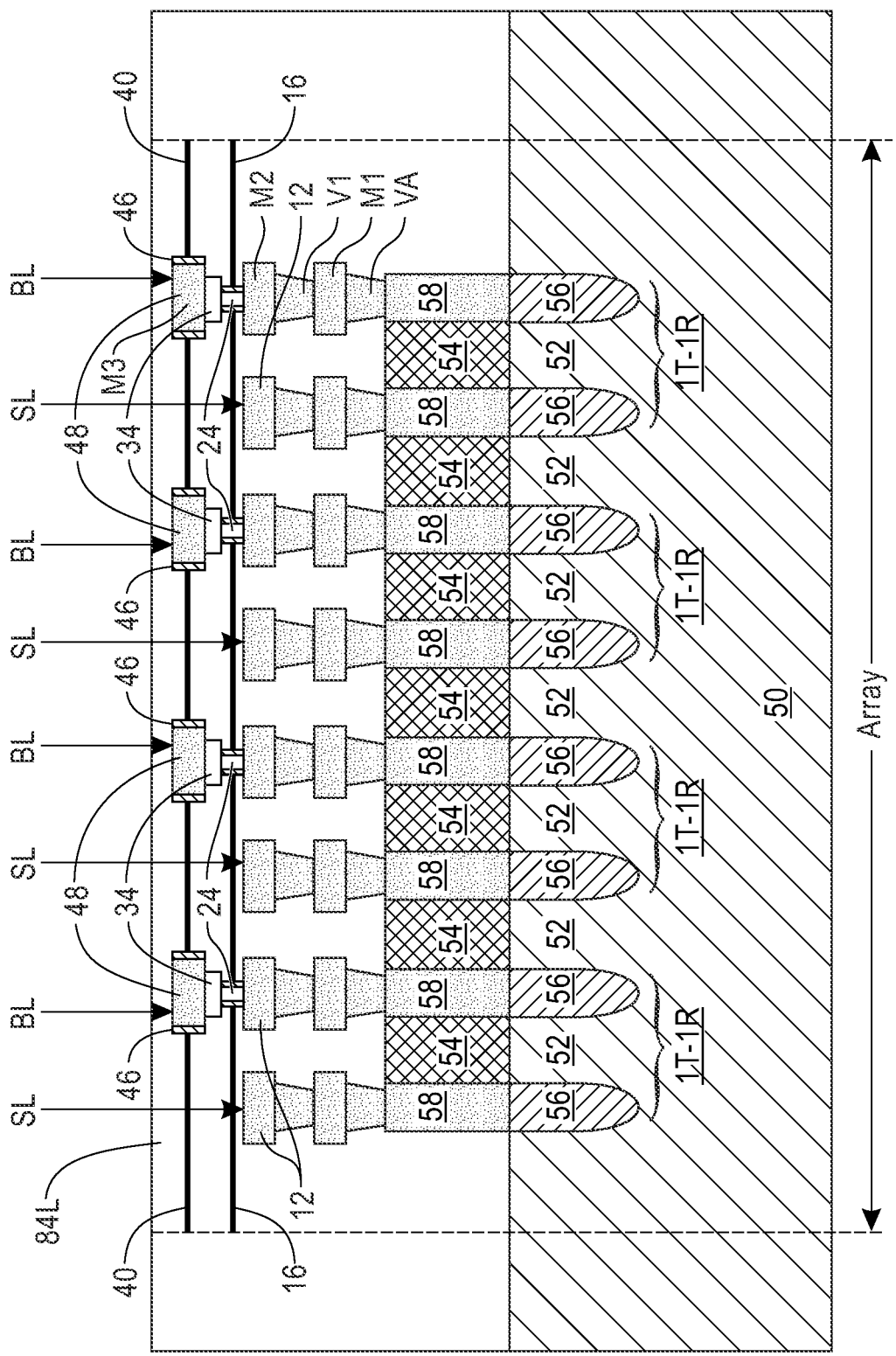
FIG. 22 is a zoomed-out version of the exemplary MRAM array architecture shown in FIG. 20 prior to forming the M4 level and V3 in the bit line of each 1T-1R non-volatile memory device.

Referring now to FIG. 22, there is illustrated a zoomed-out view of the exemplary MRAM array architecture shown in FIG. 20 prior to forming the M4 level and V3 in the bit line of each 1T-1R non-volatile memory device. This drawing is provided to shown what is happening on the edge of the array for the termination of the side shield. Like elements within FIGS. 22 and 20 are shown with like reference numerals.

Figure 23:
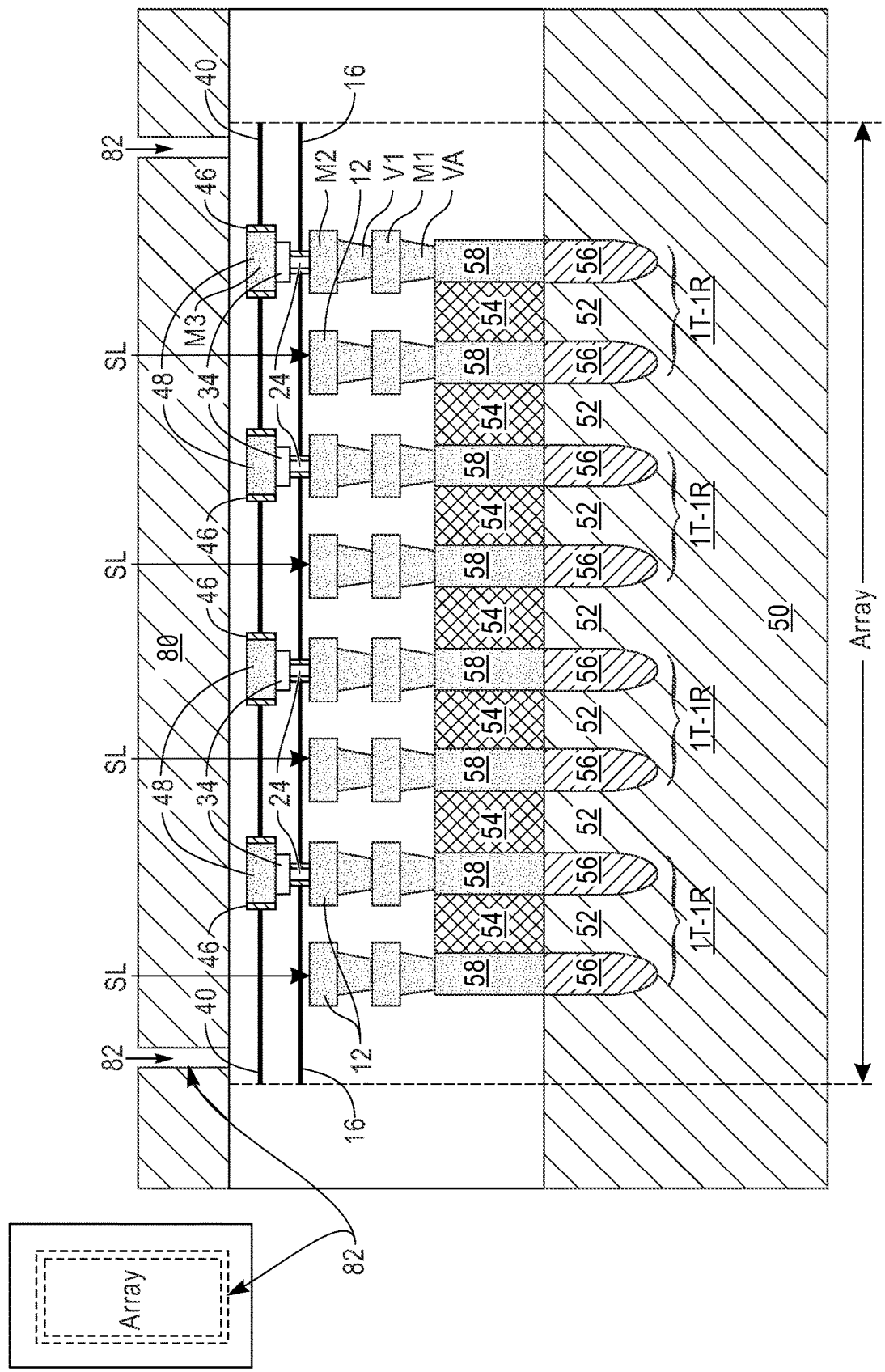
FIG. 23 is a cross sectional view of the exemplary MRAM array architecture of FIG. 22 after forming a patterned mask on the topmost ILD material layer, wherein the patterned mask has a ring opening.

Referring now to FIG. 23, there is illustrated the exemplary MRAM array architecture of FIG. 22 after forming a patterned mask 80 on the topmost ILD material layer, wherein the patterned mask 80 has a ring opening 82; see the insert containing within FIG. 23. The patterned mask 80 can include any photoresist patterning mask such as, for example, OPL. The patterned mask 80 can be formed by deposition, lithography and etching. The ring opening 82 is used to provide a ring around the MRAM array.

Figure 24:
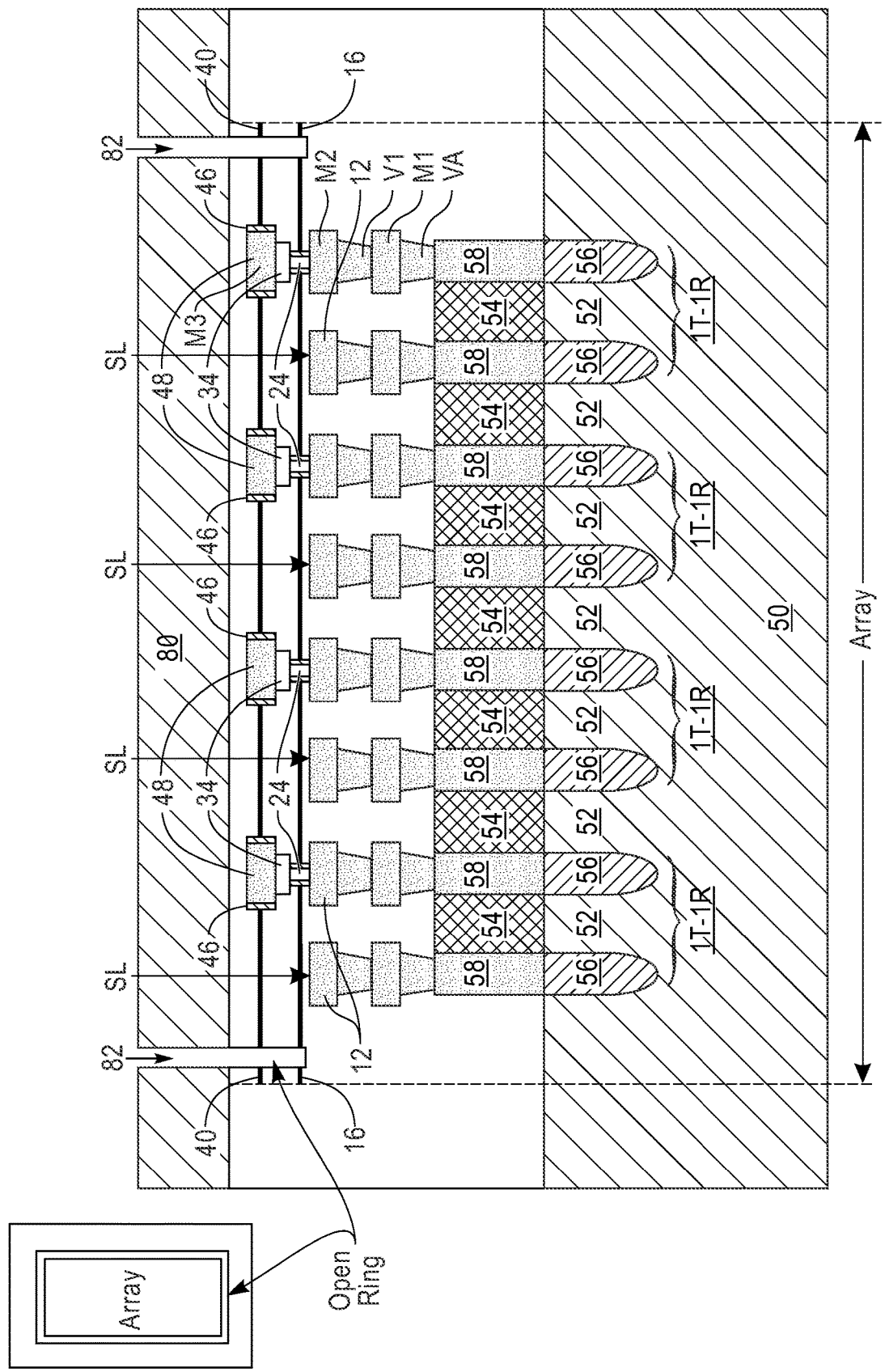
FIG. 24 is a cross sectional view of the exemplary MRAM array architecture of FIG. 23 after extending the ring opening through the top and bottom magnetic shield material-containing layers.

Referring now to FIG. 24, there is illustrated the exemplary MRAM array architecture of FIG. 24 after extending the ring opening 82 through the top and bottom magnetic shield material-containing layers 16, 40. The extending of the ring opening 82 includes a recess etching process that removes physically exposed portions of each of the topmost ILD material layer, the top magnetic shield material-containing layer 40, a lower ILD material layer, the top dielectric cladding layer (not shown), and the bottom magnetic shield material-containing layer 16; this etch stops within a lowest ILD material layer that is located beneath the bottom magnetic shield material-containing layer 16.

Figure 25:
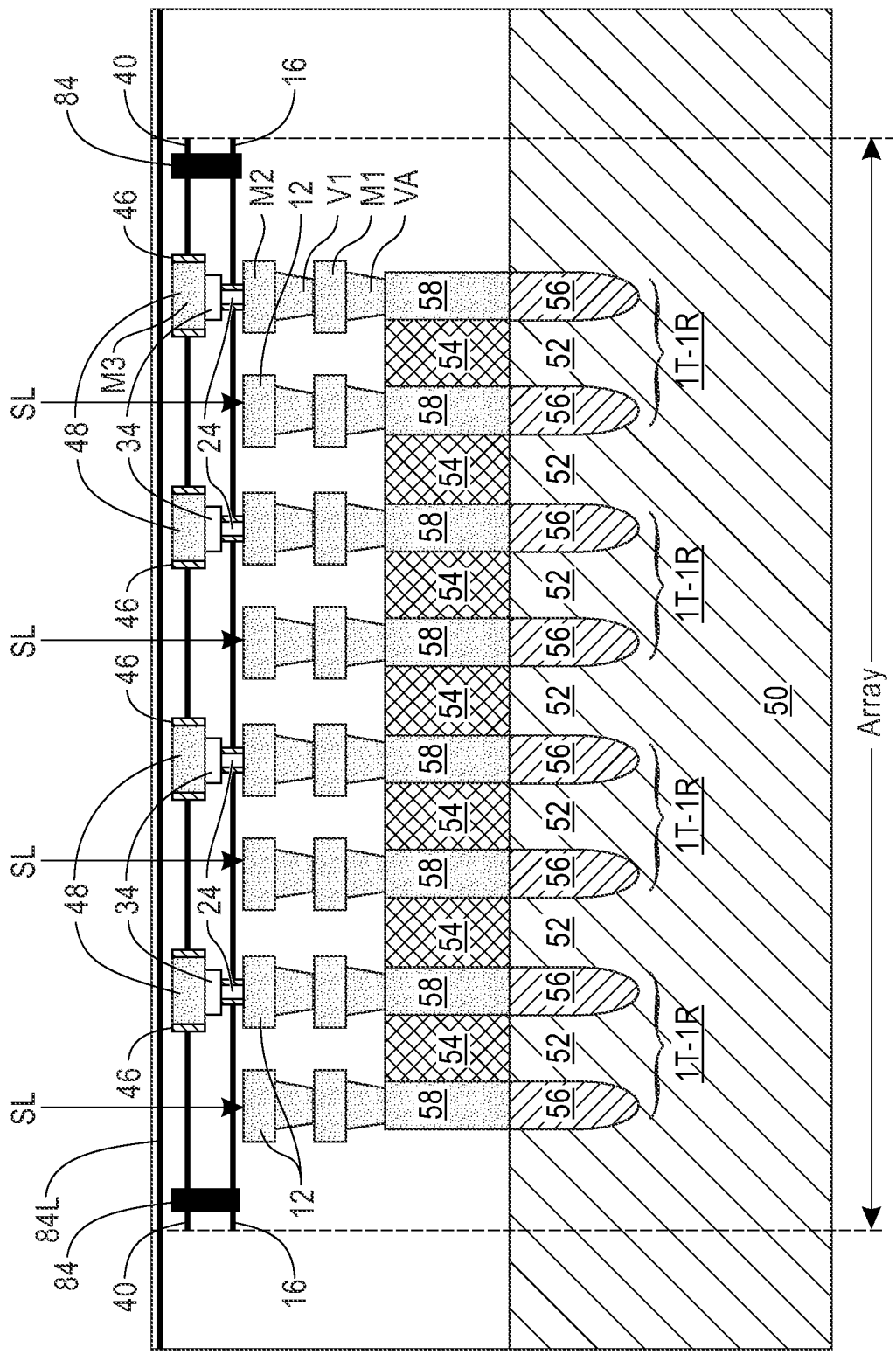
FIG. 25 is a cross sectional view of the exemplary MRAM array architecture of FIG. 24 after removing the patterned mask and forming a conformal magnetic shield containing-material layer in the extended ring opening, and on a topmost surface of the topmost ILD material layer.

Referring now to FIG. 25, there is illustrated the exemplary MRAM array architecture of FIG. 24 after removing the patterned mask 80 and forming a conformal magnetic shield containing-material layer 84L in the extended ring opening, and on a topmost surface of the topmost ILD material layer. The removal of the patterned mask can include a mask removal process such as, for example, stripping.

The conformal magnetic shield containing-material layer 84L is composed of one of the magnetic shield materials mentioned above for the bottom magnetic shield material-containing layer 16. The shielding material that provides the conformal magnetic shield containing-material layer 84L is typically the same as the magnetic shielding material that provides the top magnetic shield material-containing layer 40 and the bottom magnetic shield containing-material layer 16. The conformal magnetic shield containing-material layer 84L can be formed by deposition of magnetic shield material, followed by performing a recess etching process. The conformal magnetic shield containing-material layer 84L is formed utilizing a conformal deposition process such as, for example, CVD or PECVD. The conformal magnetic shield containing-material layer 84 within the extended ring opening is void free.

Figure 26:
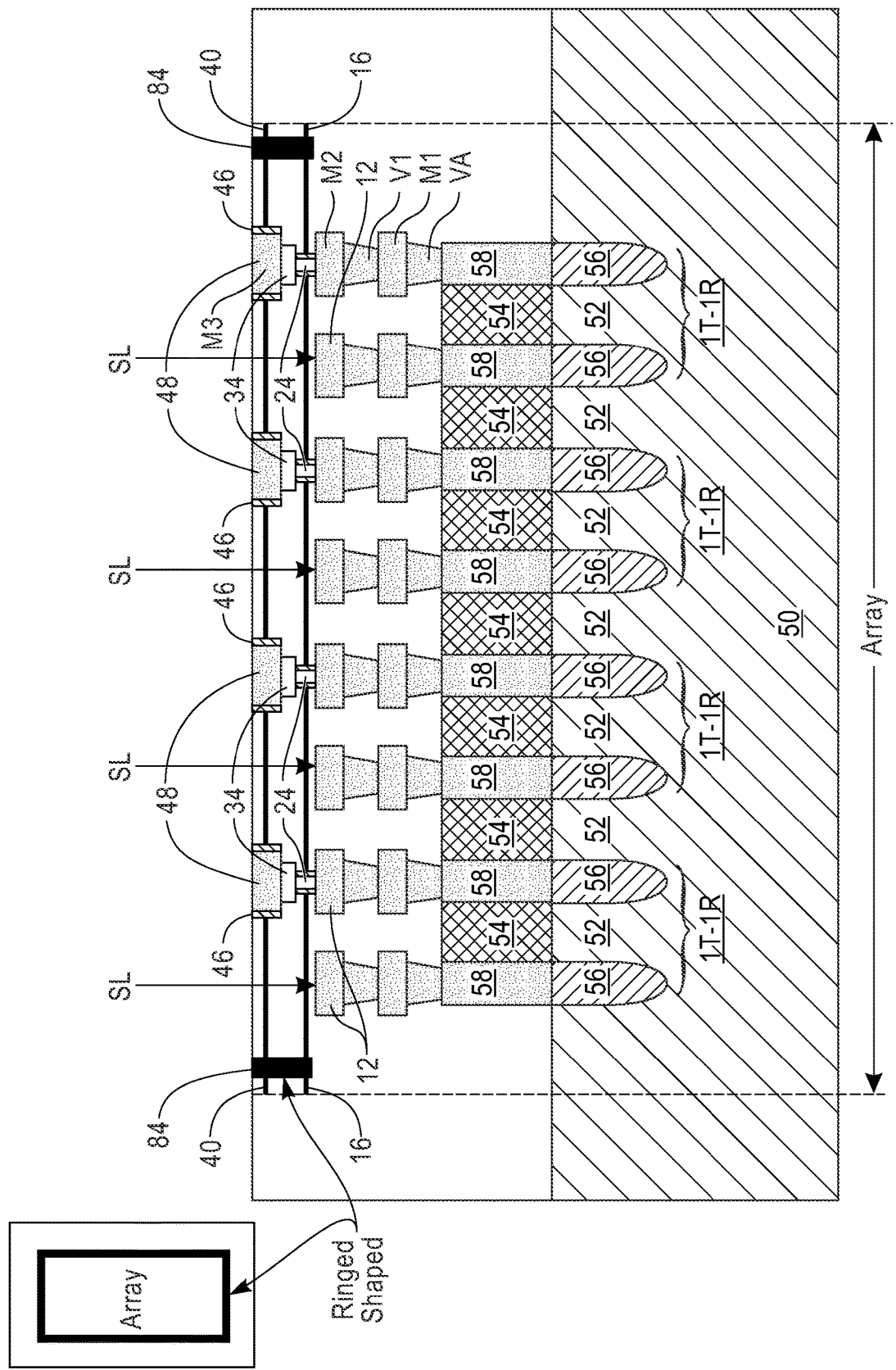
FIG. 26 is a cross sectional view of the exemplary MRAM array architecture of FIG. 25 after removing the conformal magnetic shield containing-material layer from the topmost surface of the topmost ILD material layer.

Referring now to FIG. 26, there is illustrated the exemplary MRAM array architecture of FIG. 25 after removing the conformal magnetic shield containing-material layer 84L from the topmost surface of the topmost ILD material layer. The removal of the conformal magnetic shield containing-material layer 84L from the topmost surface of the topmost ILD material layer can be performed utilizing a material removal process such as, for example, chemical mechanical planarization. A portion of the original conformal magnetic shield containing-material layer 84L remains in the extended ring opening. This remaining original conformal magnetic shield containing-material layer 84L provides a vertical magnetic shield containing-material layer 84 that connects the bottom magnetic shield containing-material layer 16 and the top magnetic shield containing-material layer 40. The vertical magnetic shield containing-material layer 84 is located near each end of both the bottom and top magnetic shield containing material layers 16, 40.

The exemplary structure shown in FIG. 26 represents another embodiment of the present application including bottom magnetic shield material-containing layer 16 and top magnetic shield material-containing layer 40 within an MRAM array including MRAM devices (i.e., bottom electrode 24, MTJ pillar 26/28/30, and top electrode 32). In this embodiment of the present application, the bottom magnetic shield material-containing layer 16 and top magnetic shield material-containing layer 40 are connected to each other by the vertical magnetic shield containing-material layer 84 that is located near each end of the bottom and top magnetic shield material-containing layers 16, 40. In this embodiment, the bottom magnetic shield material-containing layer 16 is located beneath each MTJ pillar 26, 28, 30 of the MRAM device, but above the first electrically conductive structure 12 that is in electrical contact with the MRAM device. The top magnetic shield material-containing layer 40 is located above the MRAM device, and laterally adjacent to, but not above or below, the second electrically conductive structure 48. In this embodiment, the bottom magnetic shield material-containing layer 16, the top magnetic shield material-containing layer 40 are the vertical magnetic shield containing-material layers 84 form a ring shape magnetic shield containing-material structure 16, 40, 84 that surrounds each MRAM device within the MRAM array. Stated in other terms a continuous enclosed magnetic shield box (i.e., the ring shaped magnetic shield-containing material structure 16, 40, 84) is provided that surrounds the plurality of MRAM devices.

Figure 27:
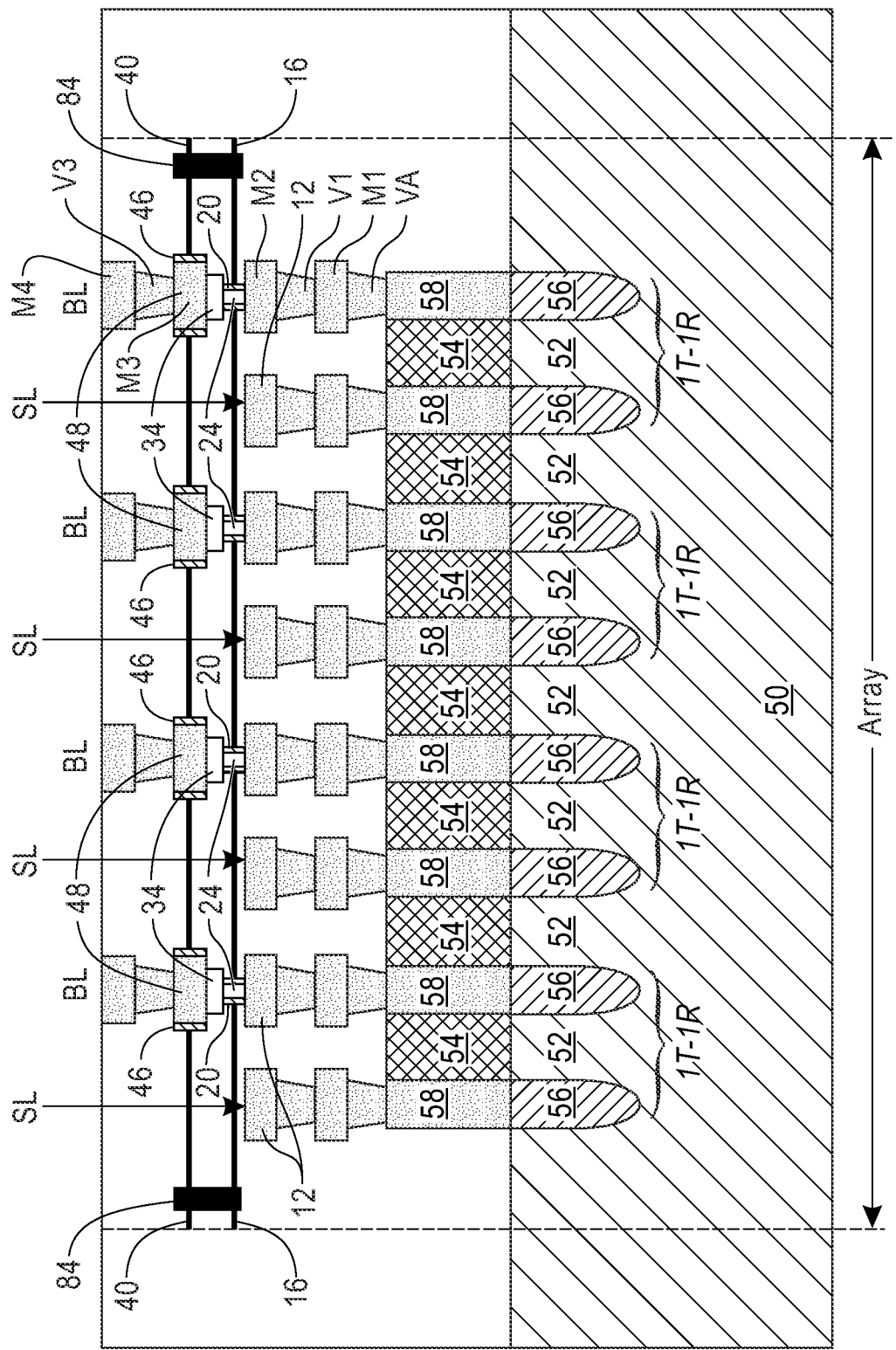
FIG. 27 is a cross sectional view of the exemplary MRAM array architecture of FIG. 26 after forming an additional ILD material layer and metal/via formation.

Referring now to FIG. 27, there is illustrated the exemplary MRAM array architecture of FIG. 26 after forming additional ILD material and metal/via formation. The metal/via formation forms an electrically conductive via, V3, and an electrically conductive structure, M4, in the added ILD material layer. The added ILD material layer includes one of the dielectric materials mentioned above for the first ILD material layer 10. The added dielectric material that can be compositionally the same as, or compositionally different from, any of the other ILD material layers that are present in the structure. The additional ILD material layer can be formed utilizing one of the deposition processes mentioned above in forming the first ILD material layer 10.

The metal/via formation includes dual damascene process to form a via opening and a line opening in the additional ILD material layer and then filling the via opening and line opening with one of the electrically conductive materials mentioned above for the first electrically conductive structures 12. A planarization process may follow the filling of the via and line openings.

The processing steps shown in FIGS. 22-27 can be used in any of the embodiments of the present invention to provide a ring shaped magnetic shield containing-material structure 16, 40, 84 (i.e., a continuous enclosed magnetic shield box) that surrounds all of the MTJ-containing structures 34 in the array.

The magnetic shielding structure (16, 40 and optionally 84) enables top and bottom, and in some instances, lateral, magnetic shielding of the MRAM devices to prevent magnetic interferences generated by external magnetic fields. The magnetic shielding structure is formed at the MRAM device level instead of at the packing level thus improving shielding efficiency. The magnetic shielding structure can be formed using a cost efficient method.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A non-volatile memory structure comprising:
   a magnetoresistive random access memory (MRAM) array comprising a plurality of MRAM devices, wherein each MRAM device of the plurality of MRAM devices comprises a bottom electrode, a magnetic tunnel junction (MTJ) pillar, and a top electrode, and each MRAM device is located between a first electrically conductive structure and a second electrically conductive structure;
   a bottom magnetic shield containing-material layer located beneath each MTJ pillar, but above the first electrically conductive structure, wherein the bottom magnetic shield containing-material layer is positioned between a bottom cladding dielectric material layer and a top cladding dielectric material layer, and wherein both the bottom cladding dielectric material layer and the top cladding dielectric material layer are located between each MTJ pillar and the first electrically conductive structure; and
   a top magnetic shield containing-material layer located above each MRAM device, wherein the top magnetic shield containing-material layer is positioned laterally adjacent to, but not above or below, the second electrically conductive structure.

2. The non-volatile memory structure of claim 1, wherein the bottom magnetic shield containing-material layer is located laterally adjacent to the bottom electrode, and wherein a bottom sidewall spacer isolates the bottom electrode from the bottom magnetic shield containing-material layer.

3. The non-volatile memory structure of claim 2, further comprising a top sidewall spacer isolating the second electrically conductive structure from the top magnetic shield containing-material layer.

4. The non-volatile memory structure of claim 2, wherein the second electrically conductive structure comprises a lower second electrically conductive structure, an inter-via magnetic shield material-containing layer and an upper second electrically conductive structure, wherein the inter-via magnetic shield material-containing layer is laterally adjacent to the top magnetic shield material-containing layer.

5. The non-volatile memory structure of claim 4, further comprising a top sidewall spacer isolating each of the lower second electrically conductive structure, the inter-via magnetic shield material-containing layer and the upper second electrically conductive structure from the top magnetic shield material-containing layer.

6. The non-volatile memory structure of claim 1, further comprising a vertical magnetic shield containing-material layer located near each end of the bottom magnetic shield containing-material layer and the top magnetic shield containing-material layer, wherein the vertical magnetic shield containing-material layer connects the bottom and top magnetic shield containing-material layers together to provide a continuous enclosed magnetic shield box all around the plurality of MRAM devices.

7. The non-volatile memory structure of claim 1, wherein the bottom magnetic shield containing-material layer and the top magnetic shield containing-material layer both comprise a magnetic shield material that provides Faraday shielding for RF magnetic fields, a magnetic shield material composed of a $\mu$-metal, a magnetic shield material composed of a superconductor material, or any multilayered stack thereof.

8. The non-volatile memory structure of claim 7, wherein the bottom magnetic shield containing-material layer and top magnetic shield containing-material layer both comprise the magnetic shield material that provides Faraday shielding for RF magnetic fields, and the magnetic shield material composed of the $\mu$-metal.

9. The non-volatile memory structure of claim 1, wherein the first electrically conductive structure is embedded in a first interlevel dielectric (ILD) material layer, the bottom electrode is embedded in a material stack comprises the bottom cladding dielectric material layer, the bottom magnetic shield containing-material layer and the top cladding dielectric material layer, and the MTJ pillar and the top electrode are embedded in a second ILD material layer, and the second electrically conductive structure is embedded in a third ILD material layer.

10. The non-volatile memory structure of claim 1, wherein the MRAM array has an architecture comprising a bit line containing at least the MRAM device, the first electrically conductive structure, and the second electrically conductive structure and is electrically connected to one source/drain region of a functional driver transistor, a source line comprising metal lines and metal vias connected to another source/drain region of the functional driver transistor, and wherein the source line and the bit line run upwards through both the bottom and top magnetic shield material-containing layers.

11. The non-volatile memory structure of claim 10, wherein the bottom magnetic shield containing-material layer is located laterally adjacent to the bottom electrode, and wherein a first bottom sidewall spacer isolates the bottom electrode from the bottom magnetic shield containing-material layer, and wherein a second bottom sidewall spacer isolates one of the metal vias of the source line from the bottom magnetic shield containing-material layer, and further wherein the first and second bottom sidewall spacers are located laterally adjacent to each other and at a same level.

12. The non-volatile memory structure of claim 11, further comprising a first top sidewall spacer isolating the second electrically conductive structure of the bit line from the top magnetic shield containing-material layer, and a second top sidewall spacer isolates one of the metal lines of the source line from the top magnetic shield containing-material layer, wherein the first and second top sidewall spacers are located laterally adjacent other and at a same level.

13. The non-volatile memory structure of claim 1, wherein the MRAM array has an architecture comprising a bit line containing at least the MRAM device, the first electrically conductive structure, and the second electrically conductive structure and is electrically connected to one source/drain region of a functional driver transistor, a source line comprising metal lines and metal vias connected to another source/drain region of the functional driver transistor, and wherein only the bit line runs upward through both the bottom and top magnetic shield material-containing layers, and the source line is located beneath the bottom magnetic shield material-containing layer.

14. The non-volatile memory structure of claim 13, wherein the bottom magnetic shield containing-material layer is located laterally adjacent to the bottom electrode, and wherein a bottom sidewall spacer isolates the bottom electrode from the bottom magnetic shield containing-material layer.

15. The non-volatile memory structure of claim 14, further comprising a top sidewall spacer isolating the second electrically conductive structure from the top magnetic shield containing-material layer.

16. A method of forming a non-volatile memory structure, the method comprising:
forming a magnetic shield-containing material stack on a metal level containing first electrically conductive structures embedded in a first interlayer dielectric (ILD) material layer, wherein the magnetic shield-containing material stack includes a bottom magnetic shield material-containing layer sandwiched between a bottom cladding dielectric material layer and a top cladding dielectric material layer;
forming a plurality of openings in the magnetic shield-containing material stack, wherein each opening physically exposes a surface of one of the first electrically conductive structures embedded in the first ILD material layer;
forming a bottom sidewall spacer and a bottom electrode structure in each of the openings;
forming an MTJ-containing structure on top of each bottom electrode, wherein the MTJ-containing structure comprises a MTJ pillar and a top electrode;
forming a second ILD material layer laterally surrounding and on top of each of the MTJ-containing structures;
forming a top magnetic shield material-containing layer on a topmost surface of the second ILD material layer; and
forming a third ILD material layer on the top magnetic shield material-containing layer, wherein the third ILD material layer comprises second electrically conductive structures embedded therein, wherein each second electrically conductive structure contacts a surface of one of the MTJ-containing structures and is isolated from the top magnetic shield material-containing layer by a top sidewall spacer.

17. The method of claim 16, further comprising forming a vertical magnetic shield containing-material layer near each end of the bottom magnetic shield containing-material layer and the top magnetic shield containing-material layer, wherein the vertical magnetic shield containing-material layer connects the bottom and top magnetic shield containing-material layers together to provide a ring shaped magnetic shield containing-material structure.

18. The method of claim 16, wherein the second electrically conductive structure comprises a lower second electrically conductive structure, an inter-via magnetic shield material-containing layer and an upper second electrically conductive structure, wherein the inter-via magnetic shield material-containing layer is laterally adjacent to the top magnetic shield material-containing layer and is isolated from the top magnetic shield material-containing layer by the top sidewall spacer.

19. The method of claim 16, wherein the bottom magnetic shield containing-material layer and the top magnetic shield containing-material layer both comprise a magnetic shield material that provides Faraday shielding for RF magnetic fields, a magnetic shield material composed of a μ-metal, a magnetic shield material composed of a superconductor material, or any multilayered stack thereof.

20. A non-volatile memory structure comprising:
a magnetoresistive random access memory (MRAM) array comprising a plurality of MRAM devices, wherein each MRAM device of the plurality of MRAM devices comprises a bottom electrode, a magnetic tunnel junction (MTJ) pillar, and a top electrode, and each MRAM device is located between a first electrically conductiive structure and a second electrically conductive structure;
a bottom magnetic shield containing-material layer located beneath each MTJ pillar, but above the first electrically conductive structure; and
a top magnetic shield containing-material layer located above each MRAM device, wherein the top magnetic shield containing-material layer is positioned laterally adjacent to, but not above or below, the second electrically conductive structure, wherein the bottom magnetic shield containing-material layer and the top magnetic shield containing-material layer both comprise a magnetic shield that provides Faraday shielding for RF magnetic fileds, a magnetic shield material composed of μ-metal, a magnetic shield material composed of a superconductor material, or any multilayered stack thereof.

* * * * *